US010267825B2

(12) United States Patent
Sakaguchi

(10) Patent No.: US 10,267,825 B2
(45) Date of Patent: Apr. 23, 2019

(54) CURRENT SENSOR INCLUDING A HOUSING SURROUNDED BY BENT PORTIONS OF PRIMARY CONDUCTORS

(71) Applicant: Murata Manufacturing Co., Ltd., Nagaokakyo-shi, Kyoto-fu (JP)

(72) Inventor: Hitoshi Sakaguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/726,496

(22) Filed: Oct. 6, 2017

(65) Prior Publication Data

US 2018/0038896 A1 Feb. 8, 2018

Related U.S. Application Data

(63) Continuation of application No. PCT/JP2016/069841, filed on Jul. 5, 2016.

(30) Foreign Application Priority Data

Jul. 22, 2015 (JP) .................................. 2015-144808

(51) Int. Cl.
*G01R 15/14* (2006.01)
*G01R 15/20* (2006.01)
(Continued)

(52) U.S. Cl.
CPC ............ *G01R 15/146* (2013.01); *G01R 1/04* (2013.01); *G01R 15/20* (2013.01);
(Continued)

(58) Field of Classification Search
CPC .............. G01R 15/207; G01R 19/0092; G01R 31/3696; G01R 15/202; G01R 15/20;
(Continued)

(56) References Cited

U.S. PATENT DOCUMENTS 4,812,353 A * 3/1989 Yumoto ................. H05K 3/182
264/129
6,512,359 B1 * 1/2003 Tamai ................... G01R 15/207
324/117 H (Continued)

FOREIGN PATENT DOCUMENTS

JP 09-304440 A 11/1997
JP 2007-078418 A 3/2007

(Continued)

OTHER PUBLICATIONS

Official Communication issued in corresponding Japanese Patent Application No. 2017-529535, dated Jul. 17, 2018.

(Continued)

*Primary Examiner* — Vinh P Nguyen
(74) *Attorney, Agent, or Firm* — Keating & Bennett, LLP

(57) ABSTRACT

In a current sensor, primary conductors each include front and back surfaces, a length direction, a width direction orthogonal or substantially orthogonal to the length direction, and a thickness direction orthogonal or substantially orthogonal to the length direction and the width direction, and further include a bent portion surrounding at least a portion of an outer periphery of a housing at an intermediate position in the length direction when viewed in the width direction. The housing is disposed in a region surrounded by the bent portion of each of the plurality of primary conductors when viewed in the width direction.

18 Claims, 17 Drawing Sheets

(51) Int. Cl.
*G01R 19/00* (2006.01)
*G01R 33/09* (2006.01)
*G01R 33/12* (2006.01)
*G01R 33/00* (2006.01)
*G01R 1/04* (2006.01)

(52) U.S. Cl.
CPC ..... *G01R 19/0092* (2013.01); *G01R 33/0047* (2013.01); *G01R 33/093* (2013.01); *G01R 33/123* (2013.01); *H01L 2224/40245* (2013.01); *H01L 2224/73221* (2013.01)

(58) Field of Classification Search
CPC .... G01R 33/04; G01R 15/146; G01R 15/148; G01R 15/183; G01R 15/205; G01R 33/063; G01R 33/09; G01R 33/091; G01R 19/15; G01R 33/07; G01R 15/00; G01R 15/185; G01R 15/186; G01R 19/08; G01R 19/10; G01R 31/3624; G01R 33/025; G01R 1/18; G01R 33/0094; H02M 7/003; H02M 1/088; H02M 2001/0009; H02M 7/537; H01F 27/266; H01F 27/2823; H01F 27/29; H01F 27/28; H01F 38/30; H01L 2224/73265; H01L 2924/30107; H01L 2924/3025; H01L 24/36; H01L 24/37; H01L 24/40; H01L 25/071
See application file for complete search history.

(56) References Cited

U.S. PATENT DOCUMENTS

| | | | |
|---|---|---|---|
| 7,626,376 B2* | 12/2009 | Muraki | B82Y 25/00 324/117 H |
| 8,330,453 B2* | 12/2012 | Hotz | G01R 15/207 324/117 H |
| 2010/0045286 A1 | 2/2010 | Hotz et al. | |
| 2013/0257469 A1 | 10/2013 | Arima | |
| 2013/0335076 A1 | 12/2013 | Sakamoto et al. | |

FOREIGN PATENT DOCUMENTS

| | | |
|---|---|---|
| JP | 2008-039734 A | 2/2008 |
| JP | 2010-048809 A | 3/2010 |
| JP | 2013-228353 A | 11/2013 |
| JP | 2013-257294 A | 12/2013 |

OTHER PUBLICATIONS

Official Communication issued in International Patent Application No. PCT/JP2016/069841, dated Sep. 13, 2016.

* cited by examiner

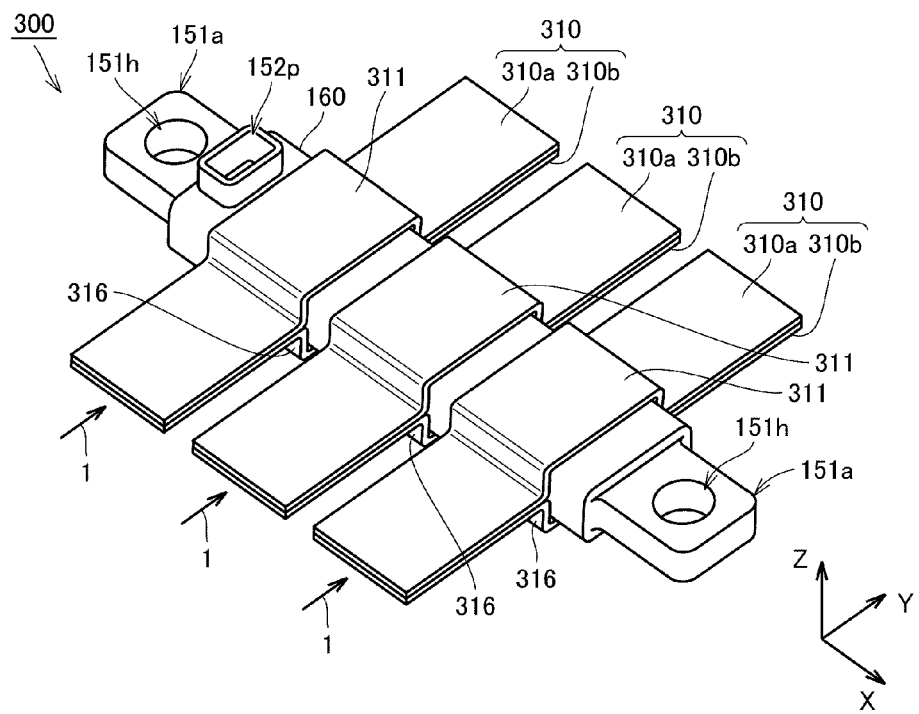
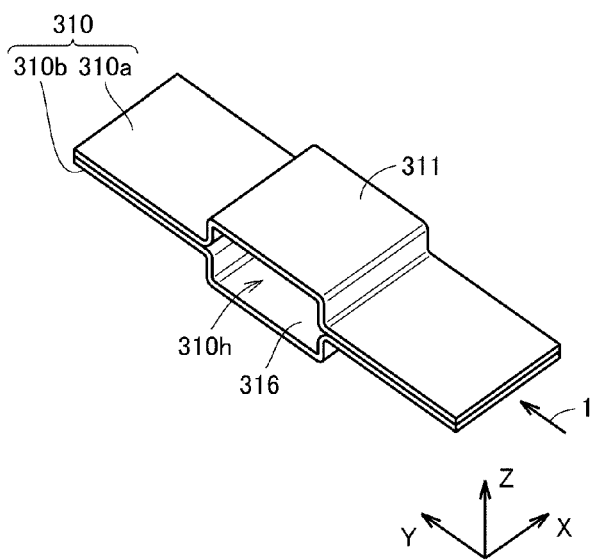

CURRENT SENSOR INCLUDING A HOUSING SURROUNDED BY BENT PORTIONS OF PRIMARY CONDUCTORS

CROSS REFERENCE TO RELATED APPLICATIONS

This application claims the benefit of priority to Japanese Patent Application No. 2015-144808 filed on Jul. 22, 2015 and is a Continuation Application of PCT Application No. PCT/JP2016/069841 filed on Jul. 5, 2016. The entire contents of each application are hereby incorporated herein by reference.

BACKGROUND OF THE INVENTION

1. Field of the Invention

The present invention relates to current sensors, and more particularly, to a current sensor that detects a current to be measured by measuring a magnetic field generated by the current to be measured.

2. Description of the Related Art

Japanese Unexamined Patent Application Publication No. 2013-257294 is an example of a document that discloses the structure of a current sensor. The current sensor described in Japanese Unexamined Patent Application Publication No. 2013-257294 includes a housing, a substrate disposed in the housing, a plurality of magnetism detection devices mounted on the substrate, and pairs of shields. Each pair of shields is disposed at both sides of one of the magnetism detection devices. The shields are disposed in the housing so as to surround current paths at both sides of the current paths, and include end portions that are arranged with predetermined gaps therebetween. The magnetism detection devices and the shields are provided for each phase of a three-phase alternating-current system.

The current sensor described in Japanese Unexamined Patent Application Publication No. 2013-257294 is configured such that primary conductors, which serve as the current paths, are inserted through holes in the housing and in spaces between the shields. Therefore, the primary conductors need to be shaped and arranged so as to be insertable through the holes in the housing. In addition, the current sensor cannot be easily assembled. Also, each magnetism detection device is disposed below a central portion of the corresponding primary conductor in a width direction, and therefore the current detection sensitivity is low.

SUMMARY OF THE INVENTION

Preferred embodiments of the present invention provide high-sensitivity current sensors that include primary conductors having a high flexibility in shape and arrangement and that are able to be easily assembled.

A current sensor according to a preferred embodiment of the present invention includes a plurality of primary conductors, through each of which a current to be measured flows and which are arranged parallel or substantially parallel to each other; a plurality of magnetic sensors, each of which corresponds to one of the plurality of primary conductors and detects an intensity of a magnetic field generated by the current to be measured that flows through the corresponding primary conductor; and a single housing that accommodates the plurality of magnetic sensors. Each of the plurality of primary conductors includes a front surface and a back surface, has a length direction, a width direction orthogonal or substantially orthogonal to the length direction, and a thickness direction orthogonal or substantially orthogonal to the length direction and the width direction, and further includes a bent portion that is bent so as to surround at least a portion of an outer periphery of the housing at an intermediate position in the length direction when viewed in the width direction. The housing is disposed in a region surrounded by the bent portion of each of the plurality of primary conductors when viewed in the width direction.

In a preferred embodiment of the present invention, the housing has a longitudinal direction that coincides or substantially coincides with the width direction of each of the plurality of primary conductors.

In a preferred embodiment of the present invention, each of the plurality of primary conductors includes one path portion and another path portion through which portions of the current separately flow at an intermediate position in the length direction. The one path portion and the other path portion each include the bent portion. The housing is disposed in a region surrounded by the bent portion of the one path portion and the bent portion of the other path portion when viewed in the width direction.

In a preferred embodiment of the present invention, each of the plurality of primary conductors includes the bent portion that bulges at the front surface of each of the plurality of primary conductors.

In a preferred embodiment of the present invention, each of the plurality of primary conductors includes the bent portion that bulges at the back surface of each of the plurality of primary conductors.

In a preferred embodiment of the present invention, the bent portion of the one path portion and the bent portion of the other path portion each include one end and another end in the length direction. The one end of the bent portion of the one path portion and the other end of the bent portion of the one path portion in the length direction are at different positions in the thickness direction. The one end of the bent portion of the other path portion and the other end of the bent portion of the other path portion in the length direction are at different positions in the thickness direction. The one end of the bent portion of the one path portion and the one end of the bent portion of the other path portion in the length direction are at same position in the thickness direction. The other end of the bent portion of the one path portion and the other end of the bent portion of the other path portion in the length direction are at same position in the thickness direction. The one path portion includes a crank portion that connects a position of the one end of the bent portion of the one path portion and a position of the other end of the bent portion of the one path portion in the thickness direction. The bent portion of the other path portion includes a crank portion that connects a position of the one end of the bent portion of the other path portion and a position of the other end of the bent portion of the other path portion in the thickness direction. The crank portion of the bent portion of the one path portion and the crank portion of the bent portion of the other path portion are spaced apart from each other in the length direction.

In a preferred embodiment of the present invention, the one path portion and the other path portion are included in a single conductor.

In a preferred embodiment of the present invention, the housing includes an engagement portion that engages with one of the plurality of primary conductors.

According to various preferred embodiments of the present invention, current sensors include primary conductors that are flexible in shape and arrangement thereof. In addition, the current sensor is able to be easily assembled and has a high sensitivity.

The above and other elements, features, steps, characteristics and advantages of the present invention will become more apparent from the following detailed description of the preferred embodiments with reference to the attached drawings.

BRIEF DESCRIPTION OF THE DRAWING

FIG. 10 is a perspective view illustrating the structure of primary conductors and a magnetic sensor unit included in a current sensor according to a third preferred embodiment of the present invention.

FIG. 11 is a perspective view illustrating the appearance of each primary conductor included in the current sensor according to the third preferred embodiment of the present invention.

DETAILED DESCRIPTION OF THE PREFERRED EMBODIMENTS

Figure 1:
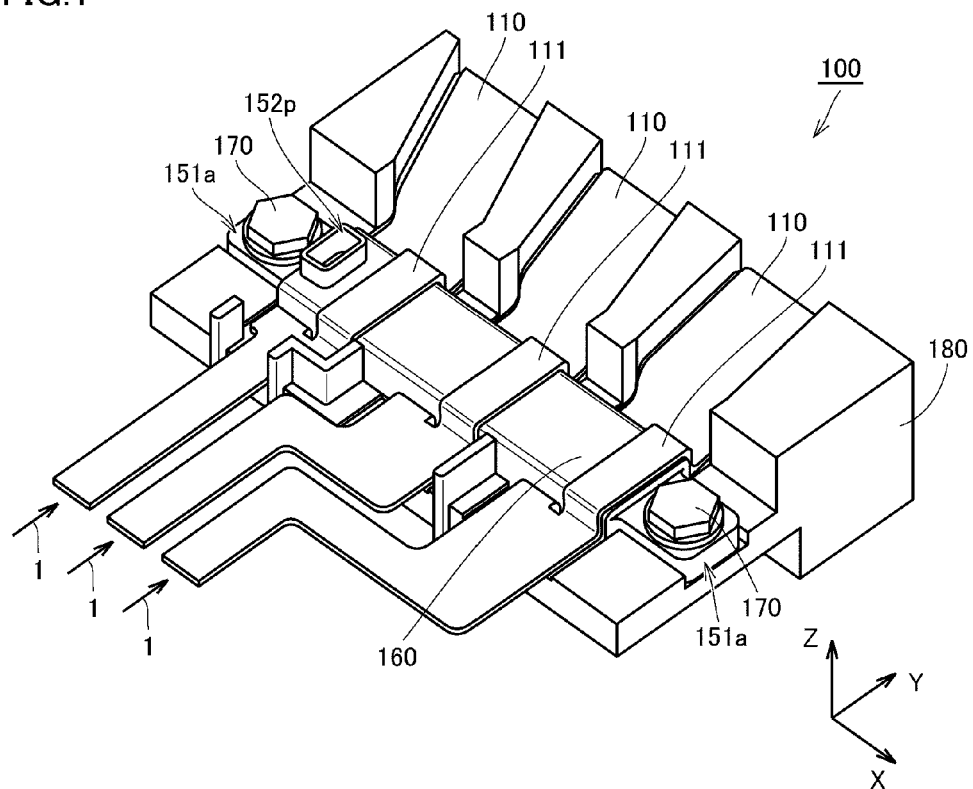
FIG. 1 is a perspective view illustrating a current sensor according to a first preferred embodiment of the present invention.

Current sensors according to preferred embodiments of the present invention will now be described with reference to the drawings. In the following description of the preferred embodiments, the same or corresponding components are denoted by the same reference numerals, and description thereof is not repeated.

First Preferred Embodiment

Figure 2:
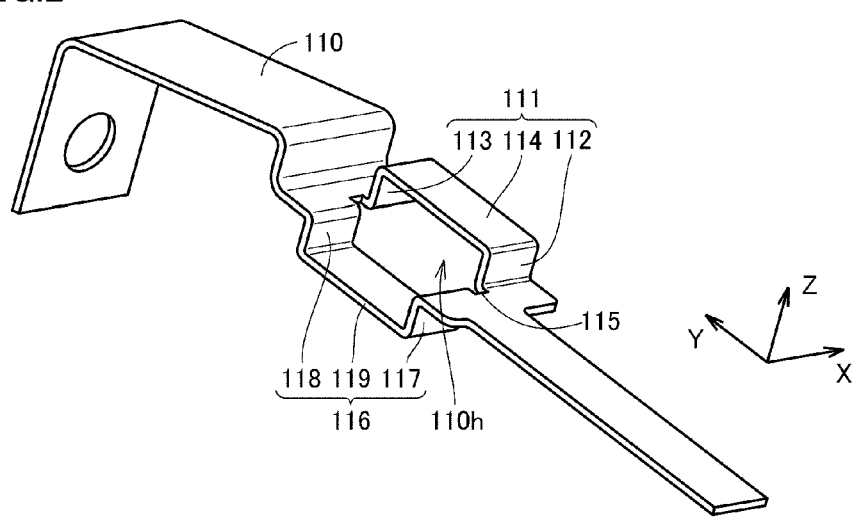
FIG. 2 is a perspective view illustrating the appearance of each primary conductor included in the current sensor according to the first preferred embodiment of the present invention.
Figure 3:
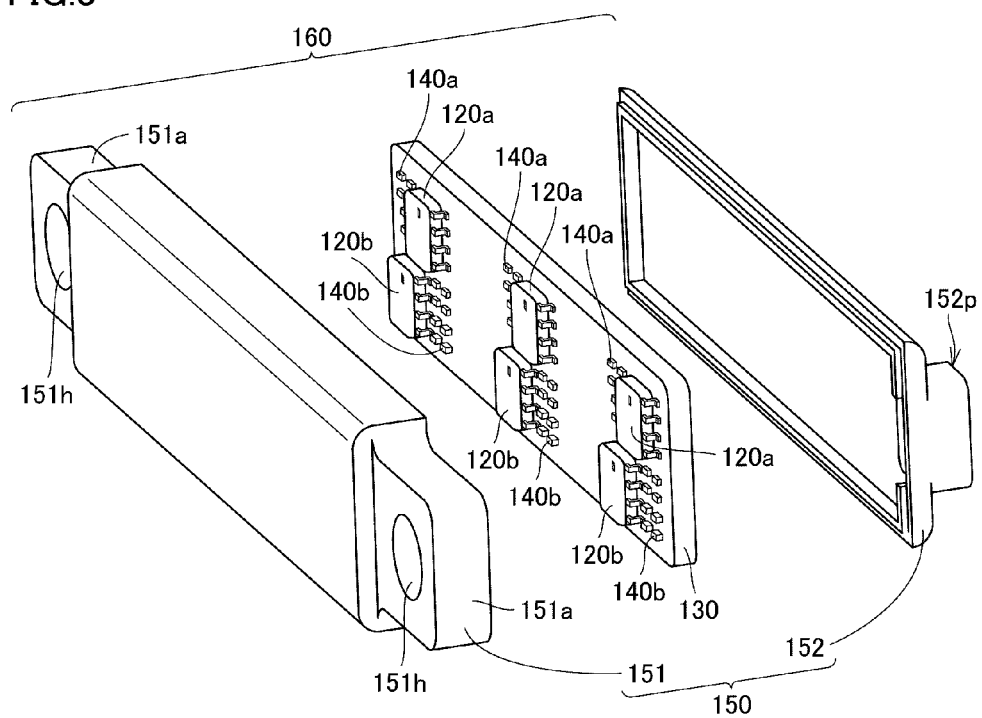
FIG. 3 is an exploded perspective view illustrating the structure of a magnetic sensor unit included in the current sensor according to the first preferred embodiment of the present invention.
Figure 4:
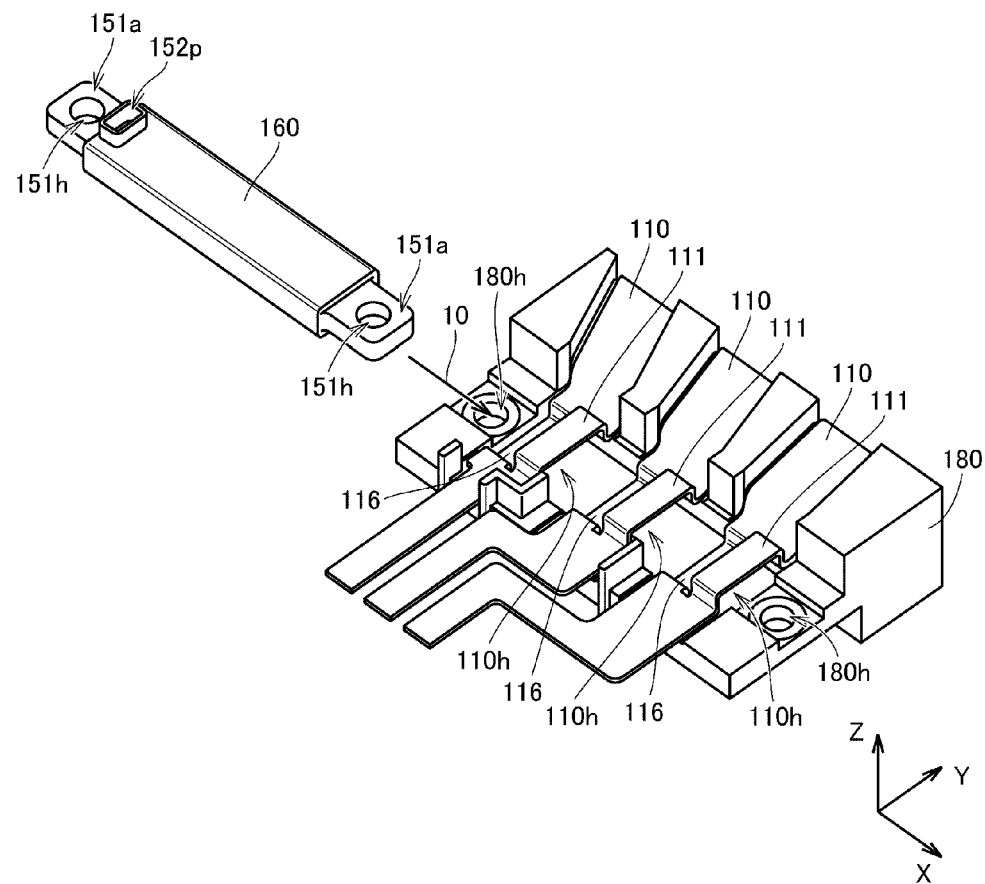
FIG. 4 is a perspective view illustrating the manner in which the magnetic sensor unit included in the current sensor according to the first preferred embodiment of the present invention is inserted into cavities in primary conductors, which will be described below.

FIG. 1 is a perspective view illustrating the appearance of a current sensor according to a first preferred embodiment of the present invention. FIG. 2 is a perspective view illustrating the appearance of each primary conductor included in the current sensor according to the first preferred embodiment of the present invention. FIG. 3 is an exploded perspective view illustrating the structure of a magnetic sensor unit included in the current sensor according to the first preferred embodiment of the present invention. FIG. 4 is a perspective view illustrating the manner in which the magnetic sensor unit included in the current sensor according to the first preferred embodiment of the present invention is inserted into cavities in primary conductors, which will be described below. In FIGS. 1, 2, and 4, the X-axis direction, the Y-axis direction, and the Z-axis direction are a width direction, a length direction, and a thickness direction, respectively, of each primary conductor 110 in a section including an arch-shaped portion, which will be described below.

As illustrated in FIGS. 1 to 4, a current sensor 100 according to the first preferred embodiment of the present invention includes three primary conductors 110, through each of which a current to be measured flows and which are arranged in parallel or substantially in parallel to each other; a plurality of magnetic sensors, each of which corresponds to one of the three primary conductors 110 and detects the intensity of a magnetic field generated by the current to be measured that flows through the corresponding primary conductor 110; and a single housing 150 that accommodates the magnetic sensors.

The current sensor 100 also includes a base 180 to which the three primary conductors 110 and a magnetic sensor unit 160 are attached. The current sensor 100 according to the present preferred embodiment is applied to, for example, three-phase three-line wiring for an inverter. The current to be measured flows through each of the three primary conductors 110 in the length direction (Y-axis direction), as shown by the arrows 1.

Although the current sensor 100 preferably includes three primary conductors 110 in the present preferred embodiment, the number of primary conductors 110 is not limited to this as long as two or more primary conductors 110 are provided. In addition, although a first magnetic sensor 120a and a second magnetic sensor 120b are preferably provided near each of the three primary conductors 110, the number of magnetic sensors provided so as to correspond to a single primary conductor 110 is not limited to two as long as one or more magnetic sensors are provided.

Each of the three primary conductors 110 preferably has a plate shape including a front surface and a back surface and having a length direction (Y-axis direction), a width direction (X-axis direction) orthogonal or substantially orthogonal to the length direction (Y-axis direction), and a thickness direction (Z-axis direction) orthogonal or substantially orthogonal to the length direction (Y-axis direction) and the width direction (X-axis direction). Each of the three primary conductors 110 also includes a bent portion that is bent so as to surround at least a portion of the outer periphery of the housing 150 at an intermediate position in the length direction (Y-axis direction) when viewed in the width direction (X-axis direction). Each of the three primary conductors 110 includes one path portion and another path portion through which portions of the current to be measured separately flow at an intermediate position in the length direction (Y-axis direction). The one path portion and the other path portion each include the bent portion.

Each of the three primary conductors 110 includes an arch-shaped portion 111, which is bent so as to project toward one side in the thickness direction (Z-axis direction) and extends in the length direction (Y-axis direction). The arch-shaped portion 111 is the bent portion of the one path portion. More specifically, when viewed in the width direction (X-axis direction), the bent portion of the one path portion bulges at the front surface of the primary conductor 110. Each of the three primary conductors 110 includes a slit 115 that extends in the length direction of the primary conductor 110 (Y-axis direction). The slit 115 is adjacent to the arch-shaped portion 111 in the width direction of the primary conductor 110 (X-axis direction). It is not necessary for the slit 115 to be provided.

Each of the three primary conductors 110 also includes an inverted-arch-shaped portion 116, which is bent so as to project toward the other side in the thickness direction (Z-axis direction) and extends in the length direction (Y-axis direction). The inverted-arch-shaped portion 116 is the bent portion of the other path portion. More specifically, when viewed in the width direction (X-axis direction), the bent portion of the other path portion bulges at the back surface of the primary conductor 110. The inverted-arch-shaped portion 116 of each of the three primary conductors 110 is disposed next to the arch-shaped portion 111 in the width direction of each of the three primary conductors 110 (X-axis direction).

In each of the three primary conductors 110, the slit 115 is provided at the center or approximate of the primary conductor 110 in the width direction of the primary conductor 110 (X-axis direction). The slit 115 is disposed between the arch-shaped portion 111 and the inverted-arch-shaped portion 116. Thus, each primary conductor 110 of the current sensor 100 includes the slit 115, which extends in the length direction (Y-axis direction), at a location between the one path portion and the other path portion. A cavity 110h is provided between the arch-shaped portion 111 and the inverted-arch-shaped portion 116. When viewed in the width direction (X-axis direction), the cavity 110h is defined by a region surrounded by the bent portion of the one path portion and the bent portion of the other path portion.

As illustrated in FIG. 2, in the present preferred embodiment, the arch-shaped portion 111 includes a first projecting portion 112, a second projecting portion 113, and an extending portion 114. The first projecting portion 112 and the second projecting portion 113 are spaced apart from each other and project in a direction orthogonal or substantially orthogonal to a principal surface of the primary conductor 110. The extending portion 114 extends in the length direction of the primary conductor 110 (Y-axis direction) and connects the first projecting portion 112 and the second projecting portion 113 to each other. The inverted-arch-shaped portion 116 includes a third projecting portion 117, a fourth projecting portion 118, and an extending portion 119. The third projecting portion 117 and the fourth projecting portion 118 are spaced apart from each other and project in a direction orthogonal or substantially orthogonal to the principal surface of the primary conductor 110. The extending portion 119 extends in the length direction of the primary conductor 110 (Y-axis direction) and connects the third projecting portion 117 and the fourth projecting portion 118 to each other.

The shapes of the arch-shaped portion 111 and the inverted-arch-shaped portion 116 are not limited to this. For example, when viewed in the width direction of the primary conductor 110 (X-axis direction), the arch-shaped portion 111 and the inverted-arch-shaped portion 116 may instead be C-shaped or semicircular. The arch-shaped portion 111 and the inverted-arch-shaped portion 116 preferably have the same or substantially the same shape. The primary conductor 110 may include a flat portion that extends continuously from the principal surface of the primary conductor 110 instead of the inverted-arch-shaped portion 116. In the present preferred embodiment, the primary conductor 110 is preferably defined by a single conductor. However, the primary conductor 110 may instead include a plurality of conductors.

In the present preferred embodiment, the primary conductor 110 is preferably made of copper, for example. However, the material of the primary conductor 110 is not limited to this, and may instead be a metal such as silver, aluminum, or iron, or an alloy containing any of these metals.

The primary conductor 110 may be surface-treated. For example, at least one plating layer made of a metal such as nickel, tin, silver, or copper or an alloy containing any of these metals may be provided on the surface of the primary conductor 110.

In the present preferred embodiment, the primary conductor 110 is preferably formed by press working, for example. However, the method for forming the primary conductor 110 is not limited to this, and the primary conductor 110 may instead be formed by, for example, cutting or molding.

As illustrated in FIG. 3, first magnetic sensors 120a and second magnetic sensors 120b are mounted on a substrate 130 together with electronic components 140a and 140b, such as amplifiers and passive components. In the present preferred embodiment, three groups of components including the first magnetic sensors 120a, the second magnetic sensors 120b, and the electronic components 140a and 140b are provided on the substrate 130 with spaces therebetween so as to correspond to the three primary conductors 110.

In each of the three groups of components, preferably the first magnetic sensor 120a and the second magnetic sensor 120b are shifted from each other in the length direction of the primary conductors 110 (Y-axis direction), and are arranged next to each other in the width direction of the primary conductors 110 (X-axis direction). The magnetic sensor unit 160 is obtained by fixing the substrate 130 to the housing 150, which is electrically insulative. Thus, the first magnetic sensors 120a, the second magnetic sensors 120b, the electronic components 140a and 140b, and the substrate 130 are disposed in the housing 150.

The substrate 130 is a printed wiring board, and includes a base material preferably made of glass epoxy, alumina, or other suitable material and wiring provided on a surface of the base material by providing a pattern in a metal foil made of copper or other suitable material.

The housing 150 is preferably rectangular- or substantially rectangular-parallelepiped-shaped, and includes a lower housing 151 and an upper housing 152. The housing 150 has a longitudinal direction. The lower housing 151 includes guide portions 151a at both ends thereof in the longitudinal direction. The guide portions 151a are used to guide the housing 150 when the housing 150 is inserted through the cavities 110h. The guide portions 151a include through holes 151h that extend therethrough in the thickness direction of the lower housing 151. Shaft portions of bolts 170 used to fix the housing 150 to the base 180 are inserted through the through holes 151h.

The upper housing 152 includes a lead hole portion 152p for a wire harness connected to the substrate 130. The lead hole portion 152p, which is located at an end portion of the upper housing 152 in the longitudinal direction, has a tubular shape and projects in a direction orthogonal or substantially orthogonal to the upper surface of the upper housing 152.

The housing 150 is made of an engineering plastic, such as polyphenylene sulfide (PPS), polybutylene terephthalate (PBT) resin, liquid crystal polymer (LCP), urethane, or nylon, for example. PPS has a high thermal resistance, and is therefore a preferred material for the housing 150 when heating of the primary conductors 110 is taken into consideration.

The substrate 130 may be fixed to the housing 150 by, for example, screw-fastening, thermal welding using a resin, or adhesive bonding. When the substrate 130 and the housing 150 are fastened together using screws, non-magnetic screws are preferably used to prevent a disturbance of the magnetic field.

The base 180 includes grooves that are shaped so as to match the shapes of the three primary conductors 110. The base 180 also includes two through holes 180h at positions corresponding to the two through holes 151h in the housing 150.

The base 180 is made of an engineering plastic, such as PPS, PBT, LCP, urethane, or nylon, for example. PPS has a high thermal resistance, and is therefore a preferred material for the base 180 when heating of the primary conductors 110 is taken into consideration.

When the three primary conductors 110 are attached to the base 180 so as to be fitted to the grooves in the base 180, the cavities 110h defined by the arch-shaped portions 111 and the inverted-arch-shaped portions 116 of the three primary conductors 110 are arranged substantially along a straight line and open in the width direction of the primary conductors 110 (X-axis direction). In the width direction of the primary conductors 110 (X-axis direction), the three arch-shaped portions 111 are evenly or substantially evenly spaced apart from each other, and the three inverted-arch-shaped portions 116 are also evenly or substantially evenly spaced apart from each other.

As illustrated in FIG. 4, the magnetic sensor unit 160 is inserted through the cavities 110h in the three primary conductors 110 from one side in the width direction of the primary conductors 110 (X-axis direction). More specifically, the housing 150 is inserted so as to be fitted to the inner sides of the arch-shaped portions 111 of the three primary conductors 110. Also, the housing 150 is inserted so as to be fitted to the inner sides of the inverted-arch-shaped portions 116 of the three primary conductors 110. When viewed in the width direction (X-axis direction), the housing 150 is disposed in the region surrounded by the bent portions of the three primary conductors 110. In the present preferred embodiment, when viewed in the width direction (X-axis direction), the housing 150 is disposed in the region surrounded by the bent portion of the one path portion and the bent portion of the other path portion of each of the three primary conductors 110. Accordingly, the longitudinal direction of the housing 150 coincides or substantially coincides with the width direction of each of the three primary conductors 110 (X-axis direction).

As illustrated in FIGS. 1 and 4, the bolts 170 are inserted through the through holes 151h and the through holes 180h, and are screwed into nuts (not shown), so that the magnetic sensor unit 160 and the base 180 are fastened together. Accordingly, the positional relationship between the magnetic sensor unit 160 and the primary conductors 110 is fixed. Each of the bolts 170 and nuts is preferably made of a non-magnetic material.

Figure 5:
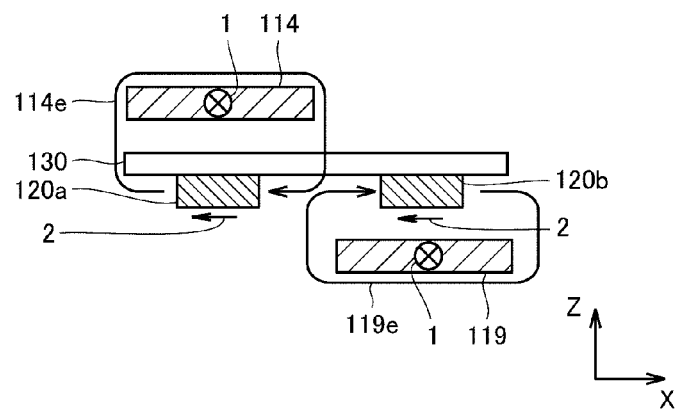
FIG. 5 is a sectional view of the current sensor according to the first preferred embodiment of the present invention, illustrating an arch-shaped portion and an inverted-arch-shaped portion of each primary conductor viewed in a length direction of the primary conductor (Y-axis direction).
Figure 6:
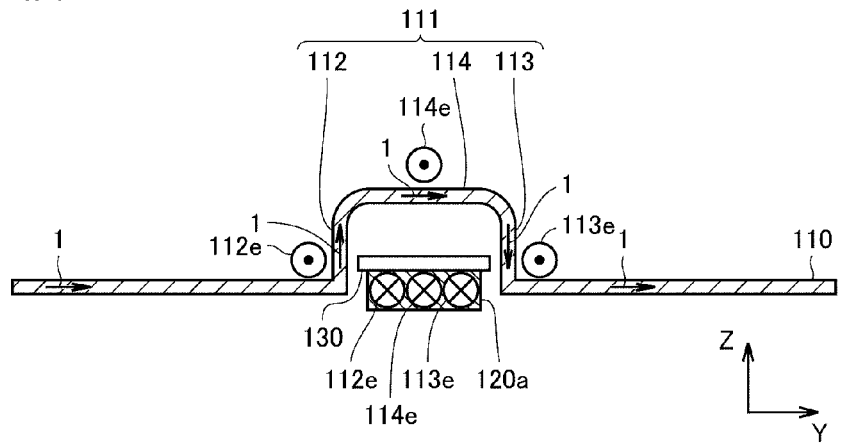
FIG. 6 is a sectional view of the current sensor according to the first preferred embodiment of the present invention, illustrating the arch-shaped portion of the primary conductor viewed in a width direction of the primary conductor (X-axis direction).
Figure 7:
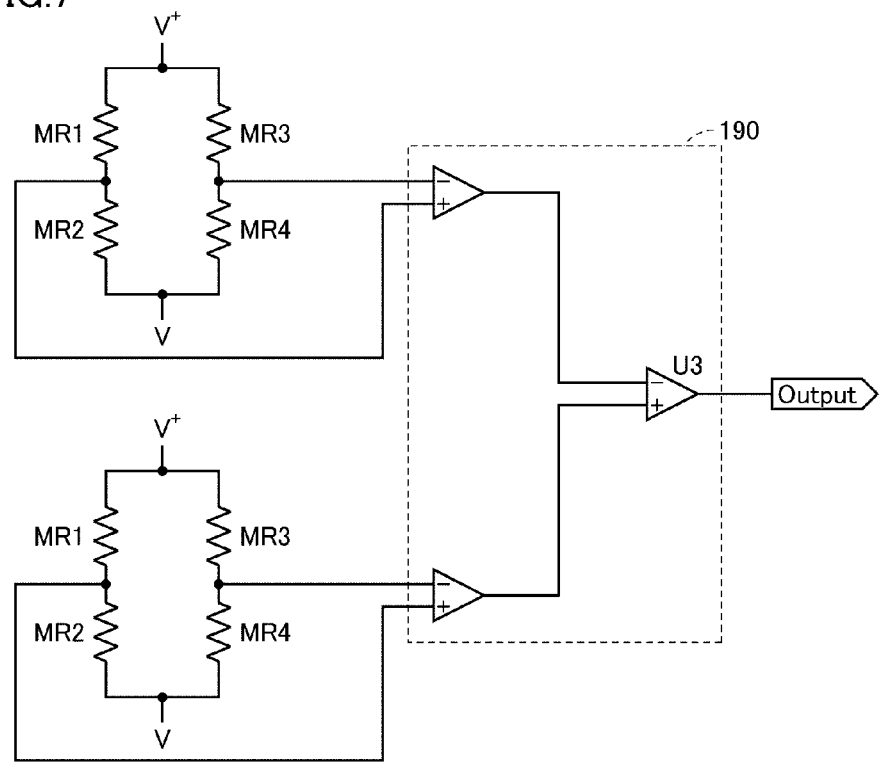
FIG. 7 is a circuit diagram illustrating the circuitry of the current sensor according to the first preferred embodiment of the present invention.

FIG. 5 is a sectional view of the current sensor according to the first preferred embodiment of the present invention, illustrating the arch-shaped portion and the inverted-arch-shaped portion of each primary conductor viewed in the length direction of the primary conductor (Y-axis direction). FIG. 6 is a sectional view of the current sensor according to the first preferred embodiment of the present invention, illustrating the arch-shaped portion of each primary conductor viewed in the width direction of the primary conductor (X-axis direction). FIG. 7 is a circuit diagram illustrating the circuitry of the current sensor according to the first preferred embodiment of the present invention.

In FIGS. 5 and 6, the X-axis direction, the Y-axis direction, and the Z-axis direction are the width direction, the length direction, and the thickness direction, respectively, of the primary conductor 110 in a section including the arch-shaped portion 111. In FIGS. 5 and 6, the housing 150 is not illustrated. FIG. 7 illustrates the circuitry of a section corresponding to one of the three groups of components.

As illustrated in FIGS. 5 and 6, when the housing 150 is inserted so as to be fitted to the inner side of the arch-shaped portion 111 of each of the three primary conductors 110, the first magnetic sensor 120*a* of each of the three groups of components is at the inner side of the arch-shaped portion 111 and behind the extending portion 114. Also, the second magnetic sensor 120*b* of each of the three groups of components is disposed at the inner side of the inverted-arch-shaped portion 116 and in front of the extending portion 119. Thus, when viewed in the width direction (X-axis direction), the first magnetic sensor 120*a* is disposed in the above-described region and behind the one path portion. Also, when viewed in the width direction (X-axis direction), the second magnetic sensor 120*b* is disposed in the above-described region and in front of the other path portion.

In the present preferred embodiment, the substrate 130 is preferably arranged so that the mounting surface of the substrate 130 is parallel or substantially parallel to the principal surface of each primary conductor 110. However, the substrate 130 may instead be arranged so that the mounting surface of the substrate 130 is perpendicular or substantially perpendicular to the principal surface of each primary conductor 110.

In each of the three groups of components, the first magnetic sensor 120*a* and the second magnetic sensor 120*b* each detect the magnetic field around the corresponding primary conductor 110 in the width direction (X-axis direction). More specifically, the first magnetic sensor 120*a* and the second magnetic sensor 120*b* each includes a detection axis 2 that extends in the width direction of the primary conductor 110 (X-axis direction).

Each of the first magnetic sensor 120*a* and the second magnetic sensor 120*b* has odd-function input/output characteristics such that a positive value is output when a magnetic field directed toward one side in the detection axis 2 is detected and such that a negative value is output when a magnetic field directed toward a side opposite to the one side in the detection axis 2 is detected.

As illustrated in FIG. 7, in the current sensor 100 according to the present preferred embodiment, each of the first magnetic sensor 120*a* and the second magnetic sensor 120*b* preferably includes a Wheatstone bridge circuit including four anisotropic magneto resistance (AMR) elements. Each of the first magnetic sensor 120*a* and the second magnetic sensor 120*b* may instead include magnetoresistive elements, such as giant magneto resistance (GMR) elements, tunnel magneto resistance (TMR) elements, ballistic magneto resistance (BMR) elements, or colossal magneto resistance (CMR) elements, for example, instead of the AMR elements.

Each of the first magnetic sensor 120*a* and the second magnetic sensor 120*b* may instead include a half bridge circuit including two magnetoresistive elements. Alternatively, each of the first magnetic sensor 120*a* and the second magnetic sensor 120*b* may be a magnetic sensor including a Hall element, a magnetic sensor including a magneto impedance (MI) element that utilizes a magnetic impedance effect, or a flux-gate magnetic sensor, for example. The magnetoresistive elements or the magnetic element, such as the Hall element, may be packaged by using a resin, or may be potted with a silicone resin or an epoxy resin.

In the case where a plurality of magnetic elements are packaged, the magnetic elements may all be packaged together, or be packaged individually. Also, the magnetic elements may be integrated and packaged together with the electronic components.

In the present preferred embodiment, the AMR elements preferably include barber-pole electrodes, and therefore provide the odd-function input/output characteristics. More specifically, the magnetoresistive elements included in each of the first magnetic sensor 120*a* and the second magnetic sensor 120*b* preferably include barber-pole electrodes, and are thus biased such that a current flows in a direction at a predetermined angle with respect to the magnetization direction of magnetoresistive films included in the magnetoresistive elements.

The magnetization direction of the magnetoresistive films is preferably determined by the shape anisotropy of the magnetoresistive films. The method of adjusting the magnetization direction of the magnetoresistive films is not limited to the method that uses the shape anisotropy of the magnetoresistive films. For example, the magnetization direction of the magnetoresistive films may instead be adjusted by placing permanent magnets near the magnetoresistive films included in the AMR elements or by providing exchange couplings in the magnetoresistive films included in the AMR elements. The permanent magnets may be sintered magnets, bonded magnets, or thin films, for example. The type of the permanent magnets is not particularly limited. For example, ferrite magnets, samarium cobalt magnets, alnico magnets, or neodymium magnets may be used.

The magnetization direction of the magnetoresistive films included in the magnetoresistive elements of the first magnetic sensor 120*a* is preferably the same as the magnetization direction of the magnetoresistive films included in the magnetoresistive elements of the second magnetic sensor 120*b*. Accordingly, a reduction in the output precision due to the influence of an external magnetic field is effectively reduced or prevented.

As illustrated in FIG. 7, the current sensor 100 further includes a calculator 190 that calculates the value of the current to be measured that flows through the primary conductor 110 based on a detection value of the first magnetic sensor 120*a* and a detection value of the second magnetic sensor 120*b*. In the present preferred embodiment, the calculator 190 is preferably a differential amplifier. However, the calculator 190 may instead be a subtractor, for example.

As illustrated in FIG. 5, the current to be measured that flows through the primary conductor 110 is divided into two portions that flow through two paths, which include a first path portion that extends through the arch-shaped portion 111 and a second path portion that extends through the inverted-arch-shaped portion 116. Since the current flows through the two paths in the primary conductor 110, magnetic fields are generated around the paths in accordance with the corkscrew rule.

As illustrated in FIGS. 5 and 6, the first magnetic sensor 120a is disposed at the inner side of the arch-shaped portion 111. Therefore, a magnetic field 112e around the first projecting portion 112, a magnetic field 113e around the second projecting portion 113, and a magnetic field 114e around the extending portion 114 are applied to the first magnetic sensor 120a. Thus, the intensity of the magnetic field applied to the magnetoresistive elements of the first magnetic sensor 120a is increased, and therefore, the sensitivity of the first magnetic sensor 120a to the current to be measured that flows through the primary conductor 110 is increased.

The second magnetic sensor 120b is disposed at the inner side of the inverted-arch-shaped portion 116. Therefore, a magnetic field around the third projecting portion 117, a magnetic field around the fourth projecting portion 118, and a magnetic field 119e around the extending portion 119 are applied to the second magnetic sensor 120b. Thus, the intensity of the magnetic field applied to the magnetoresistive elements of the second magnetic sensor 120b is increased, and therefore, the sensitivity of the second magnetic sensor 120b to the current to be measured that flows through the primary conductor 110 is increased.

As illustrated in FIG. 5, the direction of the magnetic flux along the X-axis direction at a position behind the extending portion 114 is opposite to that at a position in front of the extending portion 119. In other words, the direction of the magnetic flux applied to the first magnetic sensor 120a is opposite to the direction of the magnetic flux applied to the second magnetic sensor 120b. Therefore, with regard to the intensity of the magnetic field generated by the current to be measured that flows through the primary conductor 110, the phase of the detection value of the first magnetic sensor 120a is opposite to the phase of the detection value of the second magnetic sensor 120b. Accordingly, when the value of the intensity of the magnetic field detected by the first magnetic sensor 120a is positive, the value of the intensity of the magnetic field detected by the second magnetic sensor 120b is negative.

The detection value of the first magnetic sensor 120a and the detection value of the second magnetic sensor 120b are used for calculations performed by the calculator 190. More specifically, the calculator 190 subtracts the detection value of the second magnetic sensor 120b from the detection value of the first magnetic sensor 120a. The result of the subtraction is used to calculate the value of the current to be measured that flows through the primary conductor 110.

In the current sensor 100 according to the present preferred embodiment, since the magnetic sensor unit 160 is inserted through the cavities 110h, an external magnetic field source cannot be physically disposed between the first magnetic sensor 120a and the second magnetic sensor 120b.

Accordingly, the direction of a component of the magnetic field applied to the first magnetic sensor 120a by the external magnetic field source in the direction of the detection axis is the same as that of a component of the magnetic field applied to the second magnetic sensor 120b by the external magnetic field source in the direction of the detection axis. Therefore, when the value of the intensity of the external magnetic field detected by the first magnetic sensor 120a is positive, the intensity of the external magnetic field detected by the second magnetic sensor 120b is also positive.

As a result, when the calculator 190 subtracts the detection value of the second magnetic sensor 120b from the detection value of the first magnetic sensor 120a, the magnetic field generated by the external magnetic field source is barely detected. In other words, the influence of the external magnetic field is reduced.

In a first modification of the present preferred embodiment, the direction of the detection axis of the first magnetic sensor 120a in which the detection value is positive may preferably be opposite to (differ by 180° from) the direction of the detection axis of the second magnetic sensor 120b in which the detection value is positive. In this case, when the value of the intensity of the external magnetic field detected by the first magnetic sensor 120a is positive, the value of the intensity of the external magnetic field detected by the second magnetic sensor 120b is negative.

With regard to the intensity of the magnetic field generated by the current to be measured that flows through the primary conductor 110, the phase of the detection value of the first magnetic sensor 120a is the same as the phase of the detection value of the second magnetic sensor 120b.

In this modification, an adder or a summing amplifier, for example, is preferably used as the calculator 190, instead of the differential amplifier. With regard to the intensity of the external magnetic field, when the adder or the summing amplifier adds the detection value of the first magnetic sensor 120a and the detection value of the second magnetic sensor 120b, subtraction between the absolute value of the detection value of the first magnetic sensor 120a and the absolute value of the detection value of the second magnetic sensor 120b is performed. Accordingly, the magnetic field generated by the external magnetic field source is hardly detected. In other words, the influence of the external magnetic field is reduced.

With regard to the intensity of the magnetic field generated by the current that flows through the primary conductor 110, the adder or the summing amplifier adds the detection value of the first magnetic sensor 120a and the detection value of the second magnetic sensor 120b to calculate the value of the current to be measured that flows through the primary conductor 110.

As described above, the first magnetic sensor 120a and the second magnetic sensor 120b may be arranged to have the input/output characteristics of the opposite polarities, and an adder or a summing amplifier may be used as the calculator, instead of a differential amplifier.

According to the current sensor 100 of the present preferred embodiment, the sensitivity of the current sensor 100 is able to be increased by increasing the sensitivity of each of the first magnetic sensor 120a and the second magnetic sensor 120b to the current to be measured that flows through each primary conductor 110, and the influence of the external magnetic field is able to be reduced.

In the current sensor 100 according to the present preferred embodiment, the magnetic sensor unit 160 is inserted through the cavities 110h in the three primary conductors 110 so as to be fitted in the cavities 110h, and is thus combined with the primary conductors 110. Accordingly, the shape and arrangement of portions of the primary conductors 110 other than the portions in which the cavities 110h are provided are flexible. Thus, the primary conductors 110 are flexible in shape and arrangement, and the current sensor 100 is able to be easily assembled.

In addition, the sensitivity of the current sensor 100 is able to be increased and variations in measurement precision are able to be reduced by reducing variations in the position of the first magnetic sensor 120a relative to the arch-shaped portion 111 and variations in the position of the second magnetic sensor 120b relative to the inverted-arch-shaped portion 116. As a result, the measurement repeatability and mass productivity of the current sensor 100 are able to be increased. Also, the components of the magnetic sensor unit 160 are able to be protected from an external force by the arch-shaped portion 111 and the inverted-arch-shaped portion 116.

In the current sensor 100 according to the present preferred embodiment, the arch-shaped portion 111 and the inverted-arch-shaped portion 116 preferably have the same or substantially the same electrical resistance value. Therefore, when the current to be measured flows through each primary conductor 110, the amount of heat generated by the arch-shaped portion 111 is equivalent to the amount of heat generated by the inverted-arch-shaped portion 116. As a result, the temperature around the magnetoresistive elements of the first magnetic sensor 120a is the same or substantially the same as the temperature around the magnetoresistive elements of the second magnetic sensor 120b. Thus, an error in the measurement value of the current sensor 100 due to the temperature characteristics of the magnetoresistive elements is able to be reduced.

In the current sensor 100 according to the present preferred embodiment, the one path portion and the other path portion are preferably included in a single conductor, and each of the three primary conductors 110 is preferably defined by a single conductor, for example. Therefore, the current sensor 100 is able to be easily assembled. In addition, the number of components is smaller than that in the case in which each of the three primary conductors 110 includes two conductors, and the cost is reduced accordingly.

A current sensor according to a second modification of the present preferred embodiment will now be described. The only difference between the current sensor according to the second modification of the present preferred embodiment and the current sensor 100 according to the first preferred embodiment is that the arrangement of the arch-shaped portion 111 and the inverted-arch-shaped portion 116 of one of the three primary conductors 110 is reversed in the width direction of the primary conductors 110 (X-axis direction). Description of the structure similar to that of the current sensor 100 according to the first preferred embodiment will not be repeated.

Figure 8:
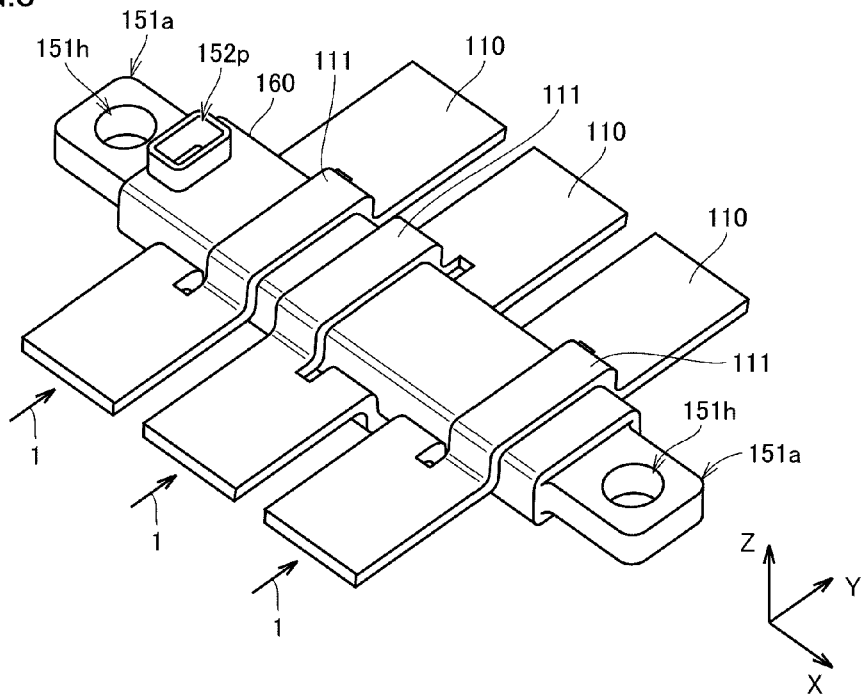
FIG. 8 is a perspective view illustrating the structure of primary conductors and a magnetic sensor unit included in a current sensor according to a second modification of the first preferred embodiment of the present invention.

FIG. 8 is a perspective view illustrating the structure of primary conductors and a magnetic sensor unit included in the current sensor according to the second modification of the first preferred embodiment of the present invention. As illustrated in FIG. 8, in the current sensor according to the second modification of the first preferred embodiment of the present invention, the arrangement of the arch-shaped portion 111 and the inverted-arch-shaped portion 116 of one of the three primary conductors 110 that is located at the center is preferably reversed in the width direction of the primary conductors 110 (X-axis direction).

When the three primary conductors 110 are arranged as described above, adjacent primary conductors 110 are arranged such that the arch-shaped portions 111 or the inverted-arch-shaped portions 116 thereof are adjacent to each other. Accordingly, in the region between the adjacent arch-shaped portions 111 or the adjacent inverted-arch-shaped portions 116, magnetic fields are generated in the opposite directions so as to cancel each other when the current to be measured flows through each of the three primary conductors 110. Therefore, the influence of the magnetic field around each primary conductor 110 on the detection value of a magnetic sensor of an adjacent primary conductor 110 is reduced.

Second Preferred Embodiment

A current sensor according to a second preferred embodiment of the present invention will now be described. A current sensor 200 according to the present preferred embodiment differs from the current sensor 100 according to the first preferred embodiment primarily in that each of the three primary conductors preferably includes two conductors. Description of the structure similar to that of the current sensor 100 according to the first preferred embodiment will not be repeated.

Figure 9:
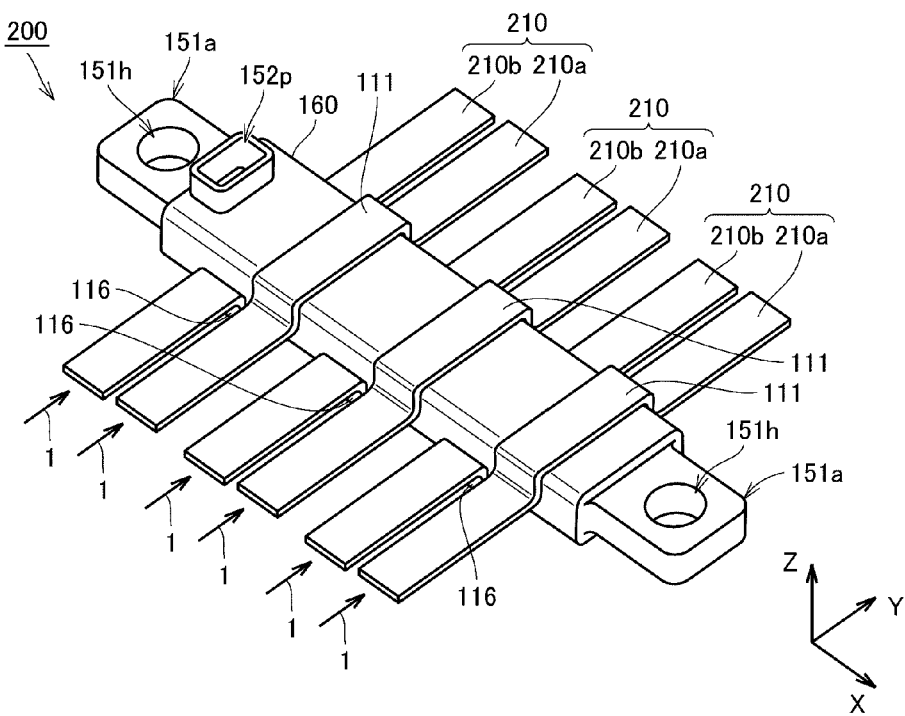
FIG. 9 is a perspective view illustrating the structure of primary conductors and a magnetic sensor unit included in a current sensor according to a second preferred embodiment of the present invention.

FIG. 9 is a perspective view illustrating the structure of primary conductors and a magnetic sensor unit included in the current sensor according to the second preferred embodiment of the present invention. As illustrated in FIG. 9, the current sensor 200 according to the second preferred embodiment of the present invention includes primary conductors 210, each of which includes two conductors that are electrically connected to each other at both ends thereof. More specifically, each primary conductor 210 includes one path portion and another path portion through which portions of the current to be measured separately flow at an intermediate position in the length direction (Y-axis direction). The one path portion and the other path portion each include a bent portion.

Among the two conductors, a first conductor 210a, which defines the one path portion, includes an arch-shaped portion 111 as the bent portion. Also, among the two conductors, a second conductor 210b, which defines the other path portion, includes an inverted-arch-shaped portion 116 as the bent portion. The first conductor 210a and the second conductor 210b, which are spaced apart from each other in the width direction of each primary conductor 210 (X-axis direction) and extend parallel or substantially parallel to each other in the length direction of each primary conductor 210 (Y-axis direction), are connected to each other at both ends thereof by connection wires (not shown).

The primary conductors 210 of the current sensor 200 according to the present preferred embodiment also have a high flexibility in shape and arrangement. In addition, the current sensor 200 is able to be easily assembled, and the sensitivity thereof is increased.

Third Preferred Embodiment

A current sensor according to a third preferred embodiment of the present invention will now be described. A current sensor 300 according to the present preferred embodiment differs from the current sensor 200 according to the second preferred embodiment primarily in that each of the three primary conductors is preferably structured by placing the first conductor on the second conductor. Description of the structure similar to that of the current sensor 200 according to the second preferred embodiment will not be repeated.

FIG. 10 is a perspective view illustrating the structure of primary conductors and a magnetic sensor unit included in the current sensor according to the third preferred embodiment of the present invention. FIG. 11 is a perspective view illustrating the appearance of each primary conductor included in the current sensor according to the third preferred embodiment of the present invention.

As illustrated in FIGS. 10 and 11, the current sensor 300 according to the third preferred embodiment of the present invention preferably includes primary conductors 310, each of which includes two conductors that are electrically connected to each other at both ends thereof. More specifically, each primary conductor 310 includes one path portion and another path portion through which portions of the current to be measured separately flow at an intermediate position in the length direction (Y-axis direction). The one path portion and the other path portion each include a bent portion. Among the two conductors, a first conductor 310a, which defines as the one path portion, includes an arch-shaped portion 311 as the bent portion. Also, among the two conductors, a second conductor 310b, which defines as the other path portion, includes an inverted-arch-shaped portion 316 as the bent portion.

The first conductor 310a and the second conductor 310b extend parallel or substantially parallel to each other in the length direction of the primary conductor 310 (Y-axis direction) and are stacked together. The first conductor 310a and the second conductor 310b, which are stacked together, are joined together at both end portions thereof by welding. A cavity 310h is provided between the arch-shaped portion 311 and the inverted-arch-shaped portion 316. When viewed in the width direction (X-axis direction), the cavity 310h is defined by a region surrounded by the bent portion of the one path portion and the bent portion of the other path portion.

The magnetic sensor unit 160 is inserted through the cavities 310h in the three primary conductors 310 from one side in the width direction of the primary conductors 310 (X-axis direction). When viewed in the width direction (X-axis direction), the housing 150 is disposed in the region surrounded by the bent portions of the three primary conductors 310. In the present preferred embodiment, when viewed in the width direction (X-axis direction), the housing 150 is disposed in the region surrounded by the bent portion of the one path portion and the bent portion of the other path portion of each of the three primary conductors 310. Accordingly, the longitudinal direction of the housing 150 coincides or substantially coincides with the width direction of each of the three primary conductors 310 (X-axis direction).

The primary conductors 310 of the current sensor 300 according to the present preferred embodiment also have a high flexibility in shape and arrangement. In addition, the current sensor 300 is able to be easily assembled, and the sensitivity thereof is increased.

Fourth Preferred Embodiment

A current sensor according to a fourth preferred embodiment of the present invention will now be described. A current sensor 400 according to the present preferred embodiment differs from the current sensor 100 according to the first preferred embodiment primarily in that the inverted-arch-shaped portion is preferably not provided. Description of the structure similar to that of the current sensor 100 according the first preferred embodiment will not be repeated.

Figure 12:
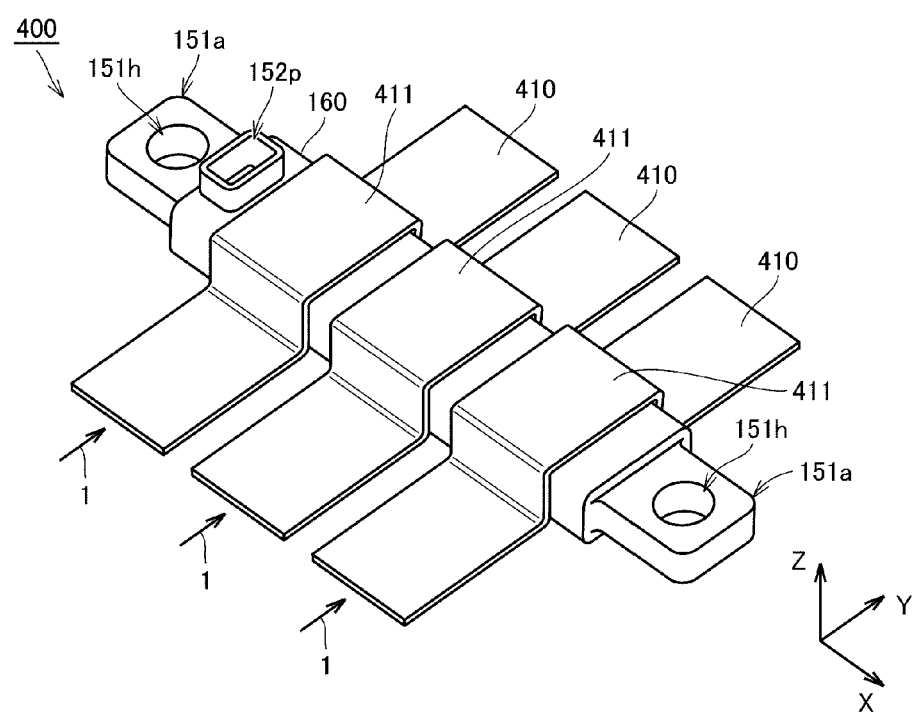
FIG. 12 is a perspective view illustrating the structure of primary conductors and a magnetic sensor unit included in a current sensor according to a fourth preferred embodiment of the present invention.

FIG. 12 is a perspective view illustrating the structure of primary conductors and a magnetic sensor unit included in the current sensor according to the fourth preferred embodiment of the present invention. As illustrated in FIG. 12, the current sensor 400 according to the fourth preferred embodiment of the present invention preferably includes primary conductors 410, each of which is preferably defined by a single conductor, for example. Each primary conductor 410 includes an arch-shaped portion 411 as a bent portion. The magnetic sensor unit 160 is inserted from one side in the width direction of the primary conductors 410 (X-axis direction) so that the magnetic sensor unit 160 is fitted to the inner sides of the arch-shaped portions 411 of the three primary conductors 410. When viewed in the width direction (X-axis direction), the housing 150 is disposed in the region surrounded by the bent portions of the three primary conductors 410.

The primary conductors 410 of the current sensor 400 according to the present preferred embodiment also have a high flexibility in shape and arrangement. In addition, the current sensor 400 is able to be easily assembled, and the sensitivity thereof is increased.

Fifth Preferred Embodiment

A current sensor according to a fifth preferred embodiment of the present invention will now be described. A current sensor 500 according to the present preferred embodiment differs from the current sensor 100 according to the first preferred embodiment primarily in that the housing preferably includes a clip portion. Description of the structure similar to that of the current sensor 100 according to the first preferred embodiment will not be repeated.

Figure 13:
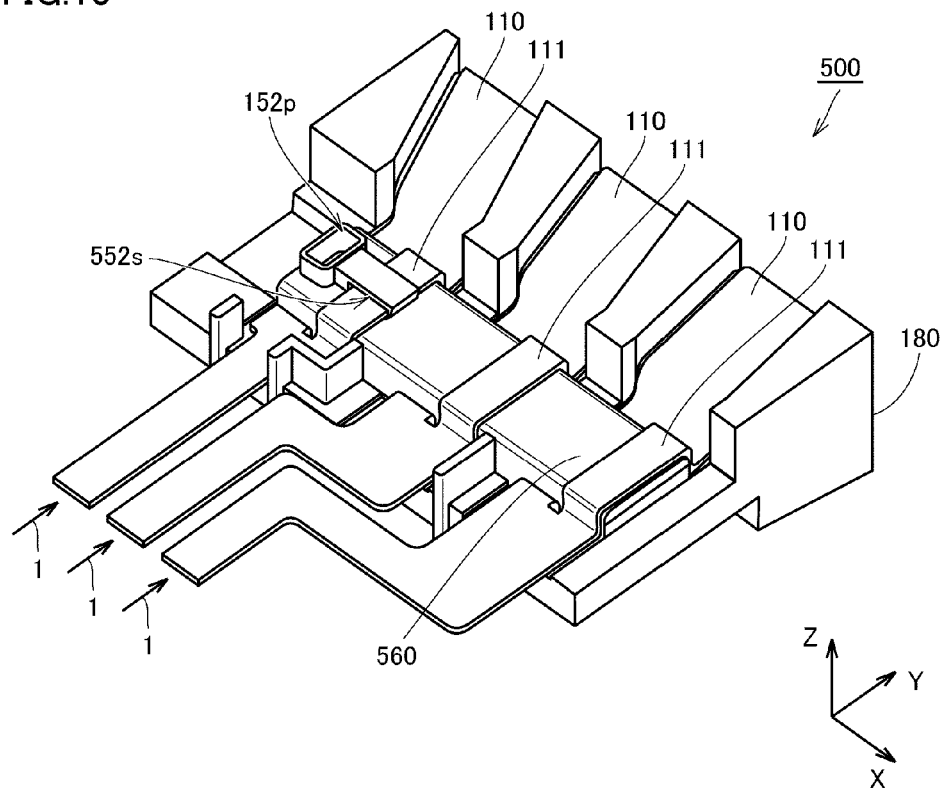
FIG. 13 is a perspective view illustrating the appearance of a current sensor according to a fifth preferred embodiment of the present invention.
Figure 14:
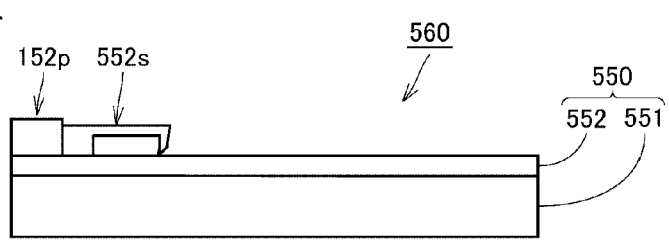
FIG. 14 is a front view illustrating the appearance of a magnetic sensor unit included in the current sensor according to the fifth preferred embodiment of the present invention.

FIG. 13 is a perspective view illustrating the appearance of the current sensor according to the fifth preferred embodiment of the present invention. FIG. 14 is a front view illustrating a magnetic sensor unit included in the current sensor according to the fifth preferred embodiment of the present invention.

As illustrated in FIGS. 13 and 14, the current sensor 500 according to the fifth preferred embodiment of the present invention preferably includes three primary conductors 110, through each of which a current to be measured flows and which are arranged parallel or substantially parallel to each other; a plurality of magnetic sensors, each of which corresponds to one of the three primary conductors 110 and detects the intensity of a magnetic field generated by the current to be measured that flows through the corresponding primary conductor 110; and a single housing 550 that accommodates the magnetic sensors. The current sensor 500 also includes a base 180 to which the three primary conductors 110 and a magnetic sensor unit 560 are attached.

The housing 550 is preferably rectangular or substantially rectangular parallelepiped-shaped, and includes a lower housing 551 and an upper housing 552. The upper housing 552 includes a lead hole portion 152p for a wire harness connected to a substrate 130 and a clip portion 552s, which is an engagement portion that engages with one of the three primary conductors 110. The lead hole portion 152p, which is located at an end portion of the upper housing 552 in the longitudinal direction, has preferably a tubular shape and projects in a direction orthogonal or substantially orthogonal to the upper surface of the upper housing 552. The clip portion 552s is disposed adjacent to the lead hole portion 152p, and extends in the longitudinal direction of the upper housing 552. When the housing 550 is inserted through cavities 110h in the three primary conductors 110, the clip portion 552s clamps one of the three primary conductors 110 that is located at one end in the width direction of the primary conductors 110 (X-axis direction) (downstream end in the insertion direction). Accordingly, the magnetic sensor unit 560 and the primary conductor 110 are fixed to each other.

The primary conductors 510 of the current sensor 500 according to the present preferred embodiment also have a high flexibility in shape and arrangement. In addition, the current sensor 500 is easily assembled, and the sensitivity thereof is increased. Furthermore, the magnetic sensor unit 560 is able to be attached to the primary conductors 110 simply by moving the magnetic sensor unit 560 in the width direction of the primary conductors 110 (X-axis direction) and causing the clip portion 552s to clamp one of the primary conductors 110. Therefore, the current sensor 500 is easily assembled. In addition, because the magnetic sensor unit 560 is not required to include portions in which the through holes 151h are provided, the size of the magnetic sensor unit 560 is able to be reduced, and the size of the current sensor 500 is reduced accordingly.

A current sensor according to a modification of the present preferred embodiment will now be described. The main difference between the current sensor according to the modification of the present preferred embodiment and the current sensor 500 according to the fifth preferred embodiment is the structure of the engagement portion of the housing. Description of the structure similar to that of the current sensor 500 according to the fifth preferred embodiment will not be repeated.

Figure 15:
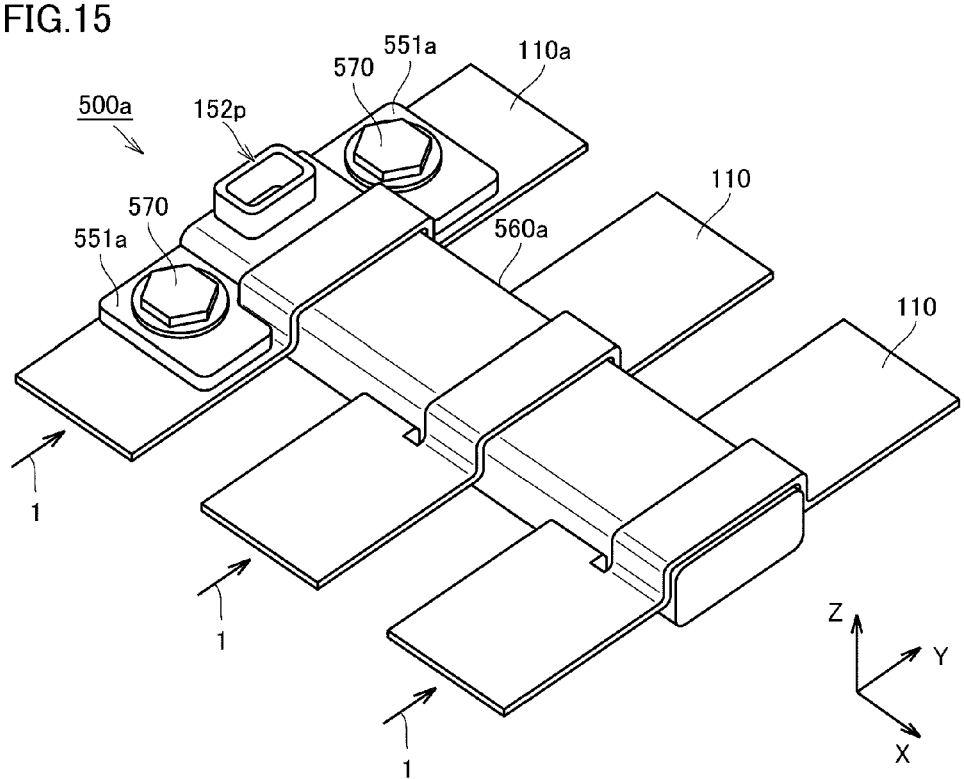
FIG. 15 is a perspective view illustrating the structure of primary conductors and a magnetic sensor unit included in a current sensor according to a modification of the fifth preferred embodiment of the present invention.

FIG. 15 is a perspective view illustrating the structure of primary conductors and a magnetic sensor unit included in the current sensor according to the modification of the fifth preferred embodiment of the present invention. As illustrated in FIG. 15, a current sensor 500a according to the modification of the fifth preferred embodiment of the present invention preferably includes a magnetic sensor unit 560a including a housing that includes two flange portions 551a. The two flange portions 551a are engagement portions that engage with a primary conductor 110a, which is one of the three primary conductors 110. The two flange portions 551a project from both side surfaces of the upper housing 552 in a direction orthogonal or substantially orthogonal to the side surfaces of the upper housing 552.

Each of the two flange portions 551a includes a through hole (not shown). The primary conductor 110a includes through holes (not shown) at positions corresponding to the through holes in the flange portions 551a. Bolts 570 are inserted through the through holes in the flange portions 551a and the through holes in the primary conductor 110a, and are screwed to nuts (not shown), so that the magnetic sensor unit 560a and the primary conductor 110a are fastened together. Each of the bolts 570 and the nuts is preferably made of a non-magnetic material.

In the current sensor 500a according to the modification of the present preferred embodiment, the magnetic sensor unit 560a is able to be reliably attached to the primary conductor 110a by the bolts 570 and nuts, for example.

Sixth Preferred Embodiment

A current sensor according to a sixth preferred embodiment of the present invention will now be described. The main difference between a current sensor 600 according to the sixth preferred embodiment and the current sensor 100 according to the first preferred embodiment is the shapes of the one path portion and the other path portion. Components similar to those of the current sensor 100 according to the first preferred embodiment are denoted by the same reference numerals, and description thereof will not be repeated.

Figure 16:
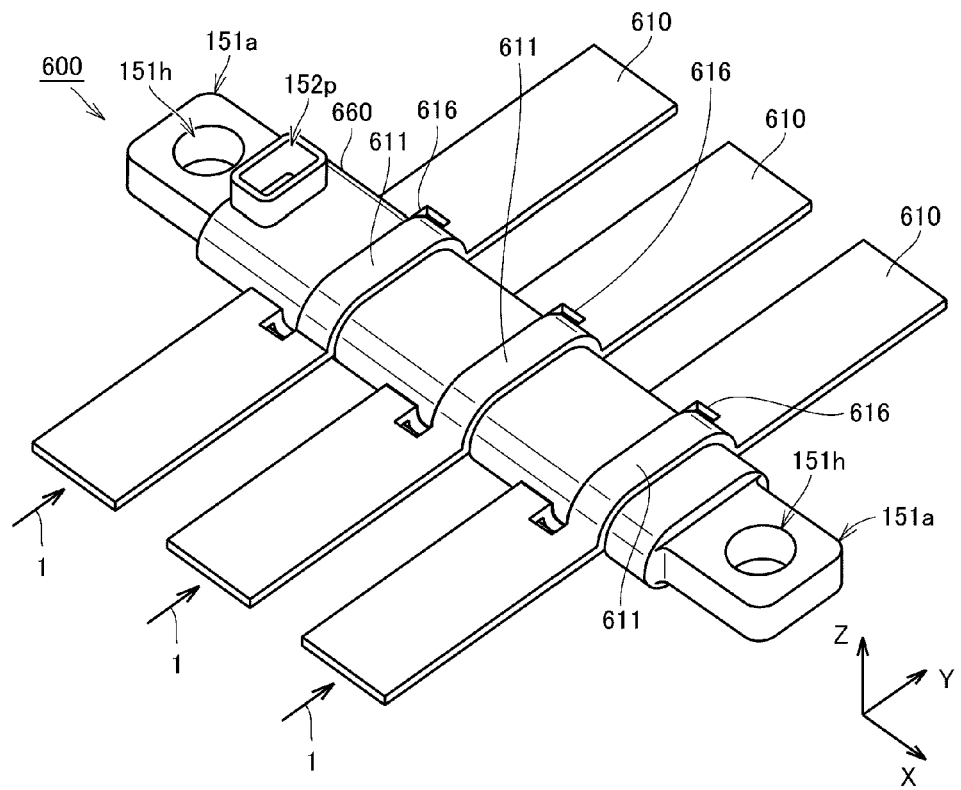
FIG. 16 is a perspective view illustrating the structure of primary conductors and a magnetic sensor unit included in a current sensor according to a sixth preferred embodiment of the present invention.
Figure 17:
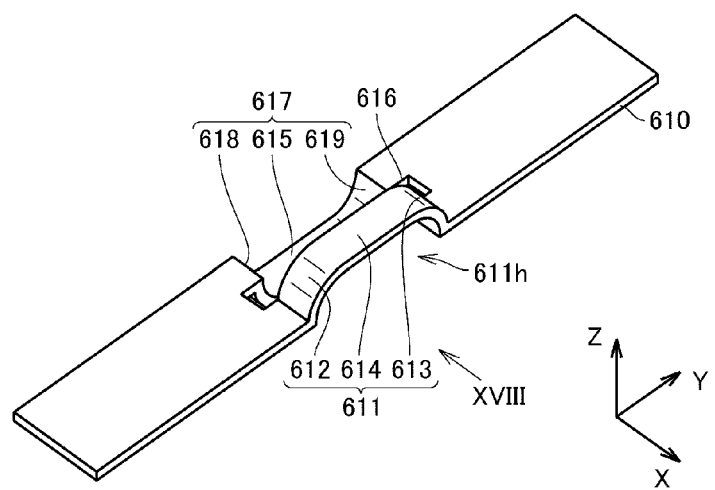
FIG. 17 is a perspective view illustrating the appearance of each primary conductor included in the current sensor according to the sixth preferred embodiment of the present invention.
Figure 18:
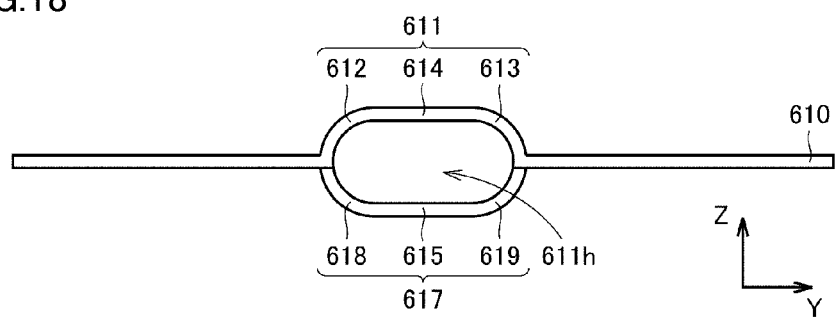
FIG. 18 is a side view of the primary conductor illustrated in FIG. 17 viewed in the direction of arrow XVIII.

FIG. 16 is a perspective view illustrating the structure of primary conductors and a magnetic sensor unit included in the current sensor according to the sixth preferred embodiment of the present invention. FIG. 17 is a perspective view illustrating the appearance of each primary conductor included in the current sensor according to the sixth preferred embodiment of the present invention. FIG. 18 is a side view of the primary conductor illustrated in FIG. 17 viewed in the direction of arrow XVIII.

As illustrated in FIGS. 16 to 18, the current sensor 600 according to the sixth preferred embodiment of the present invention preferably includes three primary conductors 610, through each of which a current to be measured flows and which are arranged parallel or substantially parallel to each other; a plurality of magnetic sensors, each of which corresponds to one of the three primary conductors 610 and detects the intensity of a magnetic field generated by the current to be measured that flows through the corresponding primary conductor 610; and a single housing that accommodates the magnetic sensors.

Each of the three primary conductors 610 allows the current to be measured to pass therethrough, and has a plate shape including a front surface and a back surface and having a length direction (Y-axis direction), a width direction (X-axis direction) orthogonal or substantially orthogonal to the length direction (Y-axis direction), and a thickness direction (Z-axis direction) orthogonal or substantially orthogonal to the length direction (Y-axis direction) and the width direction (X-axis direction). Each of the three primary conductors 610 also includes a bent portion that is bent so as to surround at least a portion of the outer periphery of the housing at an intermediate position in the length direction (Y-axis direction) when viewed in the width direction (X-axis direction). Each of the three primary conductors 610 includes one path portion and another path portion through which portions of the current to be measured separately flow at an intermediate position in the length direction (Y-axis direction). The one path portion and the other path portion each include the bent portion.

The one path portion of each of the three primary conductors 610 includes a bent portion 611 that bulges at the front surface of the primary conductor 610 when viewed in the width direction (X-axis direction). The other path portion of each of the three primary conductors 610 includes a bent portion 617 that bulges at the back surface of the primary conductor 610 when viewed in the width direction (X-axis direction). The bent portion 617 of the other path portion is disposed next to the bent portion 611 of the one path portion in the width direction of the primary conductor 610 (X-axis direction). When viewed in the width direction (X-axis direction), a region 611h is surrounded by the bent portion 611 of the one path portion and the bent portion 617 of the other path portion. A slit 616 is provided at the center or approximate center of the primary conductor 610 in the width direction of the primary conductor 610 (X-axis direction).

Each of the bent portion 611 of the one path portion and the bent portion 617 of the other path portion preferably has a semi-elliptical shape when viewed in the width direction of the primary conductor 610 (X-axis direction). The bent portion 611 of the one path portion includes a first projecting portion 612, a second projecting portion 613, and an extending portion 614. The first projecting portion 612 and the second projecting portion 613 are spaced apart from each other and project from the front surface of the primary conductor 610 in an arc shape. The extending portion 614 extends in the length direction of the primary conductor 610 (Y-axis direction) and connects the first projecting portion 612 and the second projecting portion 613 to each other. The bent portion 617 of the other path portion includes a third projecting portion 618, a fourth projecting portion 619, and an extending portion 615. The third projecting portion 618 and the fourth projecting portion 619 are spaced apart from each other and project from the back surface of the primary conductor 610 in an arc shape. The extending portion 615 extends in the length direction of the primary conductor 610 (Y-axis direction) and connects the third projecting portion 618 and the fourth projecting portion 619 to each other.

A magnetic sensor unit 660 is inserted through the space defined by the bent portion 611 of the one path portion and the bent portion 617 of the other path portion. Accordingly, when viewed in the width direction (X-axis direction), the first magnetic sensor 120a is disposed in the region 611h and behind the bent portion 611 of the one path portion. Also, when viewed in the width direction (X-axis direction), the second magnetic sensor 120b is disposed in the region 611h and in front of the bent portion 617 of the other path portion.

According to the current sensor 600 of the present preferred embodiment, the sensitivity of the current sensor 600 is able to be increased by increasing the sensitivity of each of the first magnetic sensor 120a and the second magnetic sensor 120b to the current to be measured that flows through each primary conductor 610, and the influence of the external magnetic field is reduced.

In the current sensor 600 according to the present preferred embodiment, the bent portion 611 of the one path portion and the bent portion 617 of the other path portion have the same or substantially the same electrical resistance value. Therefore, when the current to be measured flows through each primary conductor 610, the amount of heat generated by the bent portion 611 of the one path portion is equivalent or substantially equivalent to the amount of heat generated by the bent portion 617 of the other path portion. As a result, the temperature around the magnetoresistive elements of the first magnetic sensor 120a is the same or substantially the same as the temperature around the magnetoresistive elements of the second magnetic sensor 120b. Thus, an error in the measurement value of the current sensor 600 due to the temperature characteristics of the magnetoresistive elements is able to be reduced.

Figure 19:
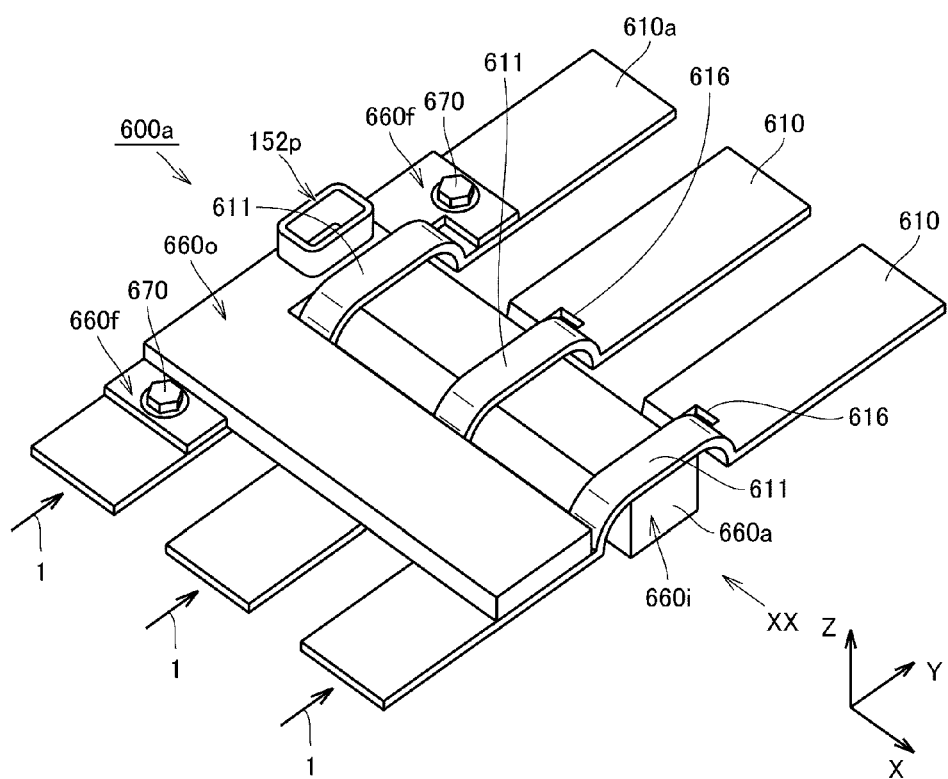
FIG. 19 is a perspective view illustrating the appearance of a current sensor according to a modification of the sixth preferred embodiment of the present invention.
Figure 20:
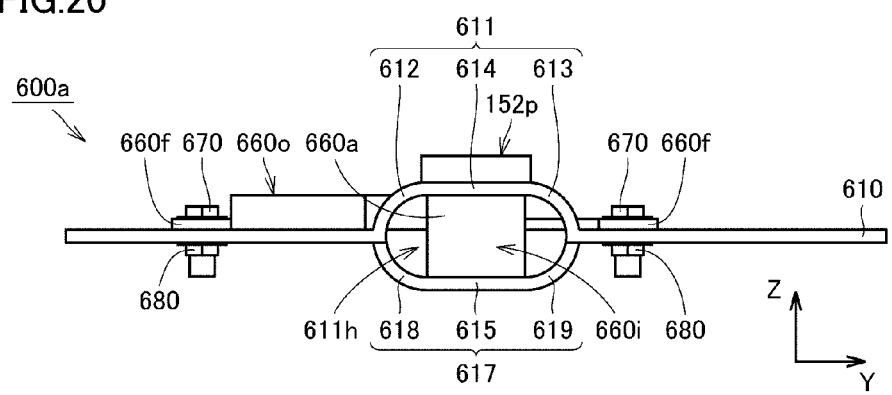
FIG. 20 is a side view of the current sensor illustrated in FIG. 19 viewed in the direction of arrow XX.
Figure 21:
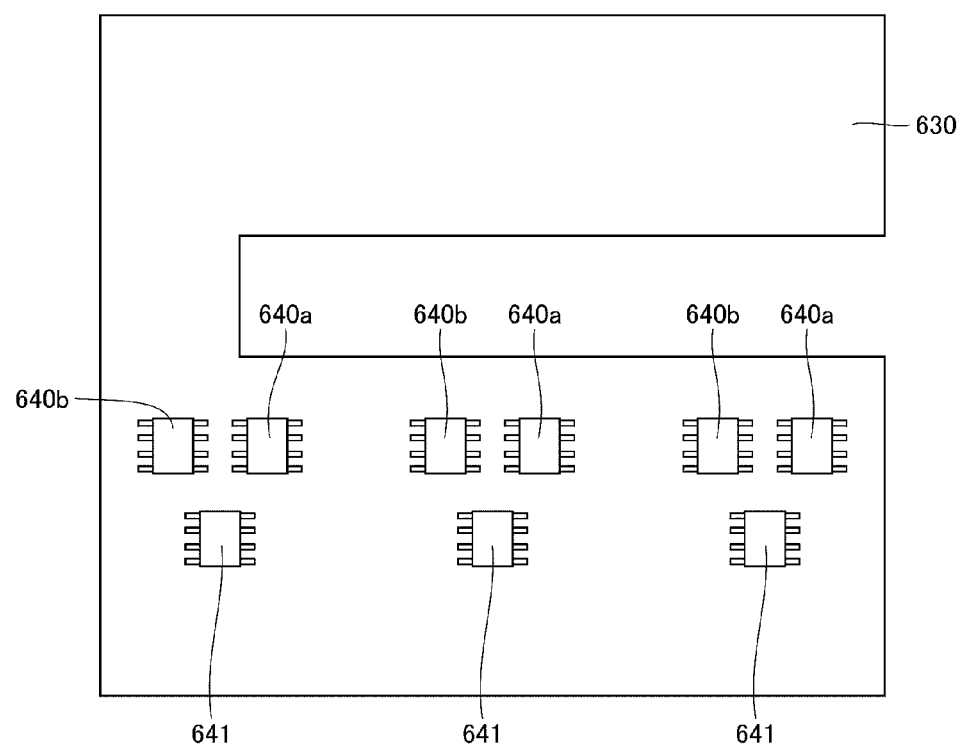
FIG. 21 illustrates a substrate of a magnetic sensor unit included in the current sensor according to the modification of the sixth preferred embodiment of the present invention viewed from the front.
Figure 22:
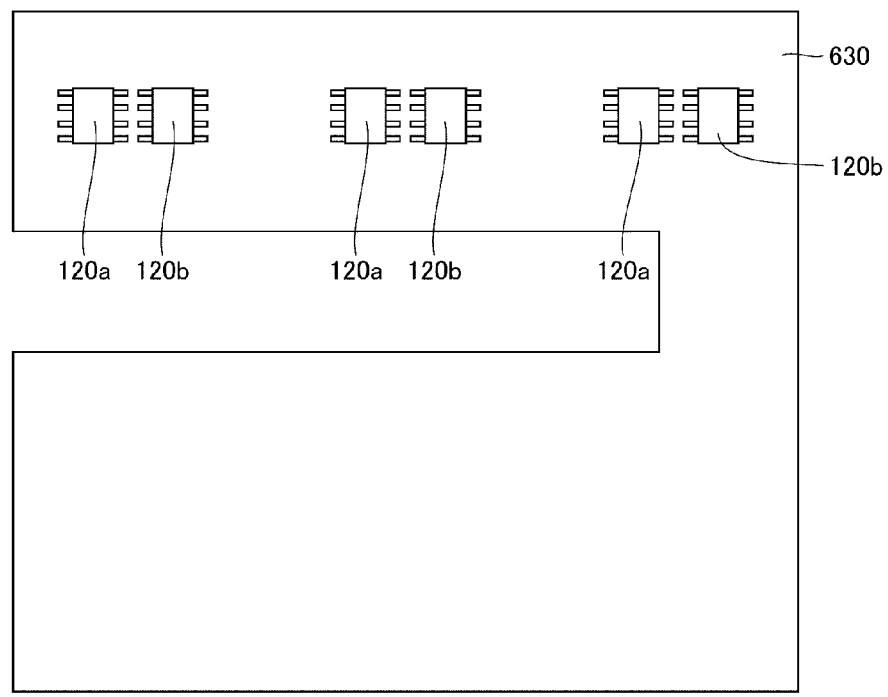
FIG. 22 illustrates the substrate of the magnetic sensor unit included in the current sensor according to the modification of the sixth preferred embodiment of the present invention viewed from the back.

The magnetic sensor unit 660 may include a portion disposed outside the space defined by the bent portion 611 of the one path portion and the bent portion 617 of the other path portion. FIG. 19 is a perspective view illustrating a current sensor according to a modification of the sixth preferred embodiment of the present invention. FIG. 20 is a side view of the current sensor illustrated in FIG. 19 viewed in the direction of arrow XX. FIG. 21 illustrates a substrate of a magnetic sensor unit included in the current sensor according to the modification of the sixth preferred embodiment of the present invention viewed from the front. FIG. 22 illustrates the substrate of the magnetic sensor unit included in the current sensor according to the modification of the sixth preferred embodiment of the present invention viewed from the back.

As illustrated in FIGS. 19 and 20, a current sensor 600a according to the modification of the sixth preferred embodiment of the present invention preferably includes a single primary conductor 610a, two primary conductors 610, and a magnetic sensor unit 660a. When viewed in the width direction (X-axis direction), the magnetic sensor unit 660a includes a magnetic-sensor-accommodating section 660i disposed in the region 611h, an electronic-component-accommodating section 660o disposed outside the region 611h, and flange portions 660f. As illustrated in FIGS. 21 and 22, electronic components 640a, 640b, and 641 are mounted on the front surface of a portion of a substrate 630 that is disposed in the electronic-component-accommodating section 660o. The electronic components 640a, 640b, and 641 define arithmetic circuits. The first magnetic sensors 120a and the second magnetic sensors 120b are mounted on the back surface of a portion of the substrate 630 that is disposed in the magnetic-sensor-accommodating section 660i.

In the present preferred embodiment, three groups of components including the first magnetic sensors 120a, the second magnetic sensors 120b, and the electronic components 640a, 640b, and 641, are provided with spaces therebetween so as to correspond to the primary conductor 610a and the two primary conductors 610.

Each of the flange portions 660f includes a through hole (not shown). The primary conductor 610a includes through holes (not shown) at positions corresponding to the through holes in the flange portions 660f. Bolts 670 are inserted through the through holes in the flange portions 660f and the through holes in the primary conductor 610a and are screwed to nuts 680, so that the magnetic sensor unit 660a and the primary conductor 610a are fastened together. Each of the bolts 670 and the nuts 680 is preferably made of a non-magnetic material.

In the current sensor 600a according to the modification of the sixth preferred embodiment of the present invention, the magnetic sensor unit 660a is reliably attached to the primary conductor 610a by using the bolts 670 and the nuts 680. In addition, the size of the region 611h is able to be reduced since the electronic components 640a, 640b, and 641, which define the arithmetic circuits, are disposed outside the region 611h. Since the size of the region 611h is reduced, the distance between the bent portion 611 of the one path portion and the first magnetic sensor 120a and the distance between the bent portion 617 of the other path portion and the second magnetic sensor 120b are also be reduced. Accordingly, the sensitivity of each of the first magnetic sensor 120a and the second magnetic sensor 120b is increased. As a result, the sensitivity of the current sensor 600a is increased and the influence of the external magnetic field is reduced.

Seventh Preferred Embodiment

A current sensor according to a seventh preferred embodiment of the present invention will now be described. The main difference between a current sensor 700 according to the seventh preferred embodiment and the current sensor 100 according to the first preferred embodiment is the shapes of the bent portion of the one path portion and the bent portion of the other path portion. Components similar to those of the current sensor 100 according to the first preferred embodiment are denoted by the same reference numerals, and description thereof will not be repeated.

Figure 23:
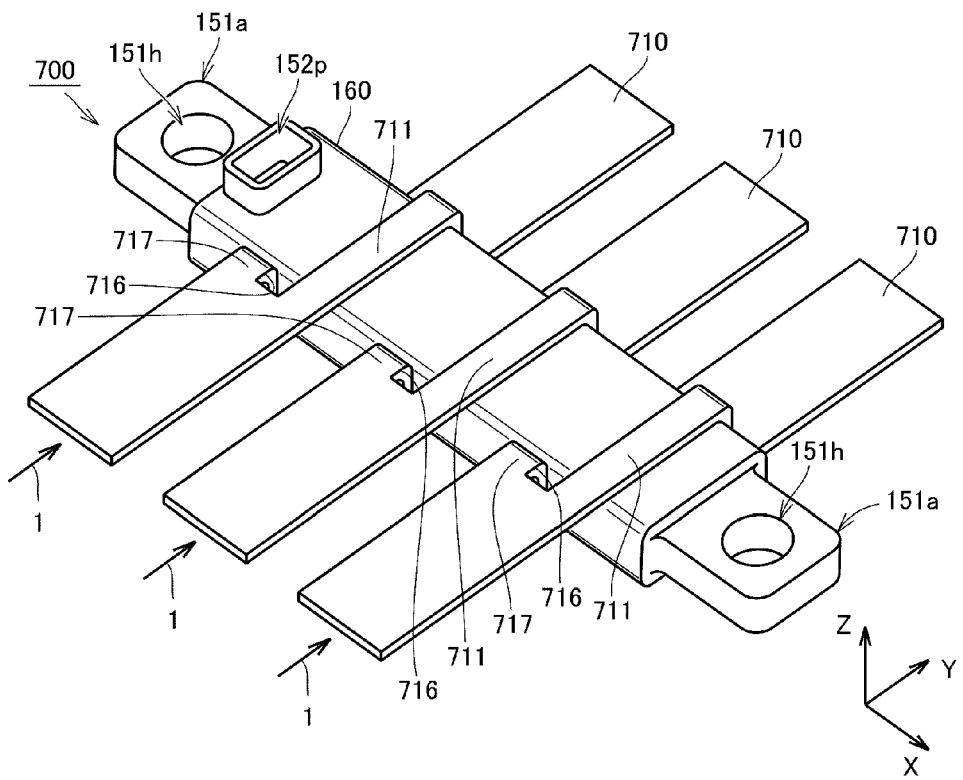
FIG. 23 is a perspective view illustrating the appearance of a current sensor according to a seventh preferred embodiment of the present invention.
Figure 24:
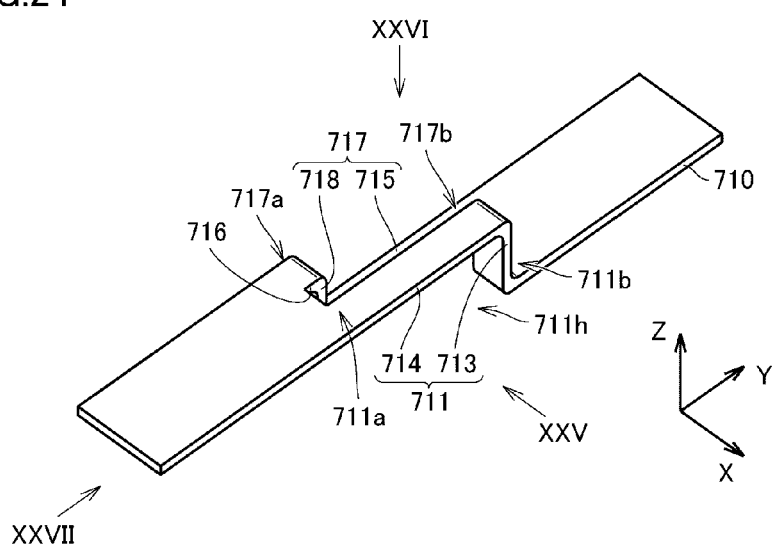
FIG. 24 is a perspective view illustrating the appearance of each primary conductor included in the current sensor according to the seventh preferred embodiment of the present invention.
Figure 25:
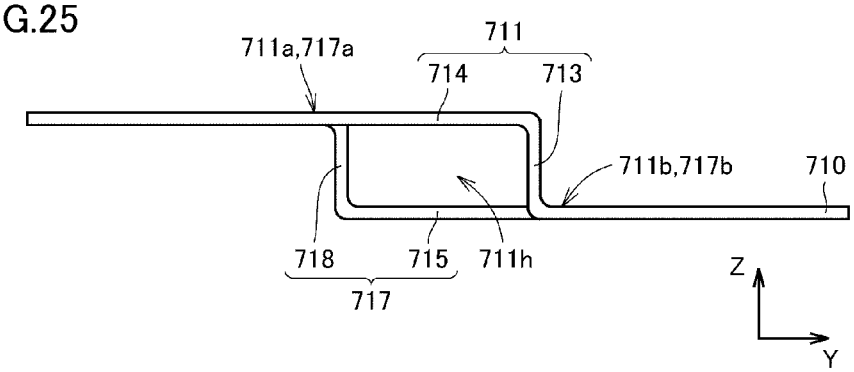
FIG. 25 is a side view of the primary conductor illustrated in FIG. 24 viewed in the direction of arrow XXV.
Figure 26:
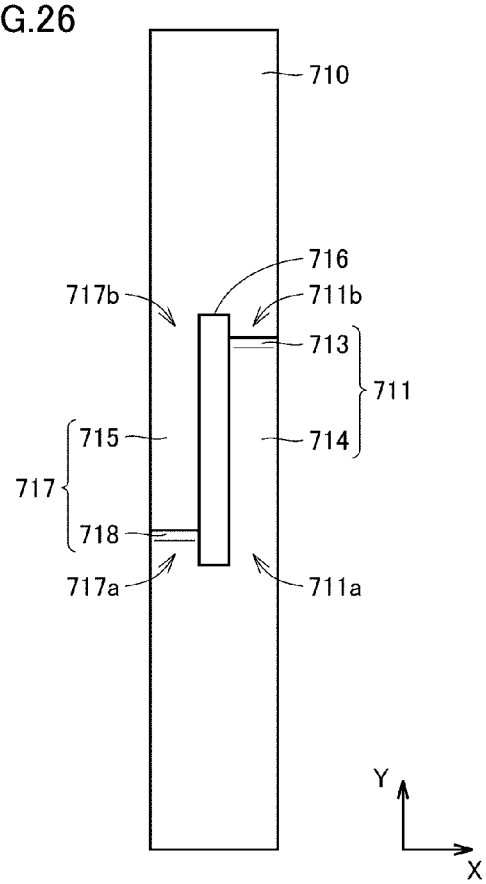
FIG. 26 is a top view of the primary conductor illustrated in FIG. 24 viewed in the direction of arrow XXVI.
Figure 27:
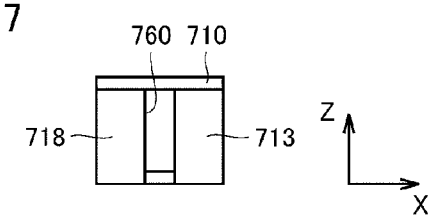
FIG. 27 is a front view of the primary conductor illustrated in FIG. 24 viewed in the direction of arrow XXVII.

FIG. 23 is a perspective view illustrating the current sensor according to the seventh preferred embodiment of the present invention. FIG. 24 is a perspective view illustrating the appearance of each primary conductor included in the current sensor according to the seventh preferred embodiment of the present invention. FIG. 25 is a side view of the primary conductor illustrated in FIG. 24 viewed in the direction of arrow XXV. FIG. 26 is a top view of the primary conductor illustrated in FIG. 24 viewed in the direction of arrow XXVI. FIG. 27 is a front view of the primary conductor illustrated in FIG. 24 viewed in the direction of arrow XXVII.

As illustrated in FIGS. 23 to 27, the current sensor 700 according to the seventh preferred embodiment of the present invention preferably includes three primary conductors 710, through each of which a current to be measured flows and which are arranged parallel or substantially parallel to each other; a plurality of magnetic sensors, each of which corresponds to one of the three primary conductors 710 and detects the intensity of the magnetic field generated by the current to be measured that flows through the corresponding primary conductor 710; and a single housing that accommodates the magnetic sensors.

Each of the three primary conductors 710 allows the current to be measured to pass therethrough, and has a plate shape including a front surface and a back surface and having a length direction (Y-axis direction), a width direction (X-axis direction) orthogonal or substantially orthogonal to the length direction (Y-axis direction), and a thickness direction (Z-axis direction) orthogonal or substantially orthogonal to the length direction (Y-axis direction) and the width direction (X-axis direction). Each of the three primary conductors 710 also includes a bent portion that is bent so as to surround at least a portion of the outer periphery of the housing at an intermediate position in the length direction (Y-axis direction) when viewed in the width direction (X-axis direction). Each of the three primary conductors 710 includes one path portion and another path portion through which portions of the current to be measured separately flow at an intermediate position in the length direction (Y-axis direction). The one path portion and the other path portion each include the bent portion.

In each of the three primary conductors 710, a bent portion 717 of the other path portion is disposed next to a bent portion 711 of the one path portion in the width direction of the primary conductor 710 (X-axis direction). When viewed in the width direction (X-axis direction), a region 711h is surrounded by the bent portion 711 of the one path portion and the bent portion 717 of the other path portion. A slit 716 is provided at the center or approximate center of the primary conductor 710 in the width direction of the primary conductor 710 (X-axis direction).

The bent portion 711 of the one path portion includes one end 711a and the other end 711b in the length direction (Y-axis direction). The bent portion 717 of the other path portion includes one end 717a and the other end 717b in the length direction (Y-axis direction). The one end 711a of the bent portion 711 of the one path portion and the one end 717a of the bent portion 717 of the other path portion are next to each other with the slit 716 provided therebetween in the width direction (X-axis direction). The other end 711b of the bent portion 711 of the one path portion and the other end 717b of the bent portion 717 of the other path portion are next to each other with the slit 716 provided therebetween in the width direction (X-axis direction).

The one end 711a of the bent portion 711 of the one path portion and the other end 711b of the bent portion 711 of the one path portion in the length direction (Y-axis direction) are at different positions in the thickness direction (Z-axis direction). The one end 717a of the bent portion 717 of the other path portion and the other end 717b of the bent portion 517 of the other path portion in the length direction (Y-axis direction) are at different positions in the thickness direction (Z-axis direction). The one end 711a of the bent portion 711 of the one path portion and the one end 717a of the bent portion 717 of the other path portion in the length direction (Y-axis direction) are at the same or substantially the same position in the thickness direction (Z-axis direction). The other end 711b of the bent portion 711 of the one path portion and the other end 717b of the bent portion 717 of the other path portion in the length direction (Y-axis direction) are at the same or substantially the same position in the thickness direction (Z-axis direction).

The bent portion 711 of the one path portion includes a crank portion 713 that connects the position of the one end 711a of the bent portion 711 of the one path portion and the position of the other end 711b of the bent portion 711 of the one path portion in the thickness direction (Z-axis direction). The bent portion 717 of the other path portion includes a crank portion 718 that connects the position of the one end 717a of the bent portion 717 of the other path portion and the position of the other end 717b of the bent portion 717 of the other path portion in the thickness direction (Z-axis direction). The crank portion 713 of the bent portion 711 of the one path portion and the crank portion 718 of the bent portion 717 of the other path portion are spaced apart from each other in the length direction (Y-axis direction).

In the present preferred embodiment, the bent portion 711 of the one path portion preferably includes an extending portion 714, which extends in the length direction (Y-axis direction) from the one end 711a, and the crank portion 713, which linearly extends in the thickness direction (Z-axis direction) from an end portion of the extending portion 714 in the length direction (Y-axis direction) to the other end 711b. In other words, the bent portion 711 of the one path portion is step-shaped. The extending portion 714 is in contact with the one end 711a of the bent portion 711 of the one path portion. The crank portion 713 is in contact with the other end 711b of the bent portion 711 of the one path portion. The shape of the crank portion 713 is not limited to the above-described shape. When viewed in the width direction (X-axis direction), the crank portion 713 may instead extend linearly in a direction that crosses the length direction (Y-axis direction) and the thickness direction (Z-axis direction), or may be curved.

The bent portion 717 of the other path portion preferably includes the crank portion 718, which linearly extends in the thickness direction (Z-axis direction) from the one end 717a, and an extending portion 715, which extends in the length direction (Y-axis direction) from an end portion of the crank portion 718 in the thickness direction (Z-axis direction) to the other end 717b. In other words, the bent portion 717 of the other path portion is step-shaped. The extending portion 715 is in contact with the other end 717b of the bent portion 717 of the other path portion. The crank portion 718 is in contact with the one end 717a of the bent portion 717 of the other path portion. The shape of the crank portion 718 is not limited to the above-described shape. When viewed in the width direction (X-axis direction), the crank portion 718 may instead extend linearly in a direction that crosses the length direction (Y-axis direction) and the thickness direction (Z-axis direction), or be curved.

A magnetic sensor unit 160 is inserted through the space defined by the bent portion 711 of the one path portion and the bent portion 717 of the other path portion. Accordingly, when viewed in the width direction (X-axis direction), the first magnetic sensor 120a is disposed in the region 711h and behind the bent portion 711 of the one path portion. Also, when viewed in the width direction (X-axis direction), the second magnetic sensor 120b is disposed in the region 711h and in front of the bent portion 717 of the other path portion.

According to the current sensor 700 of the present preferred embodiment, the sensitivity of the current sensor 700 is able to be increased by increasing the sensitivity of each of the first magnetic sensor 120a and the second magnetic sensor 120b to the current to be measured that flows through each primary conductor 710, and the influence of the external magnetic field is reduced.

In the current sensor 700 according to the present preferred embodiment, the bent portion 711 of the one path portion and the bent portion 717 of the other path portion preferably have the same or substantially the same electrical resistance value. Therefore, when the current to be measured flows through each primary conductor 710, the amount of heat generated by the bent portion 711 of the one path portion is equivalent or substantially equivalent to the amount of heat generated by the bent portion 717 of the other path portion. As a result, the temperature around the magnetoresistive elements of the first magnetic sensor 120a is the same or substantially the same as the temperature around the magnetoresistive elements of the second magnetic sensor 120b. Thus, an error in the measurement value of the current sensor 700 due to the temperature characteristics of the magnetoresistive elements is reduced.

Figure 28:
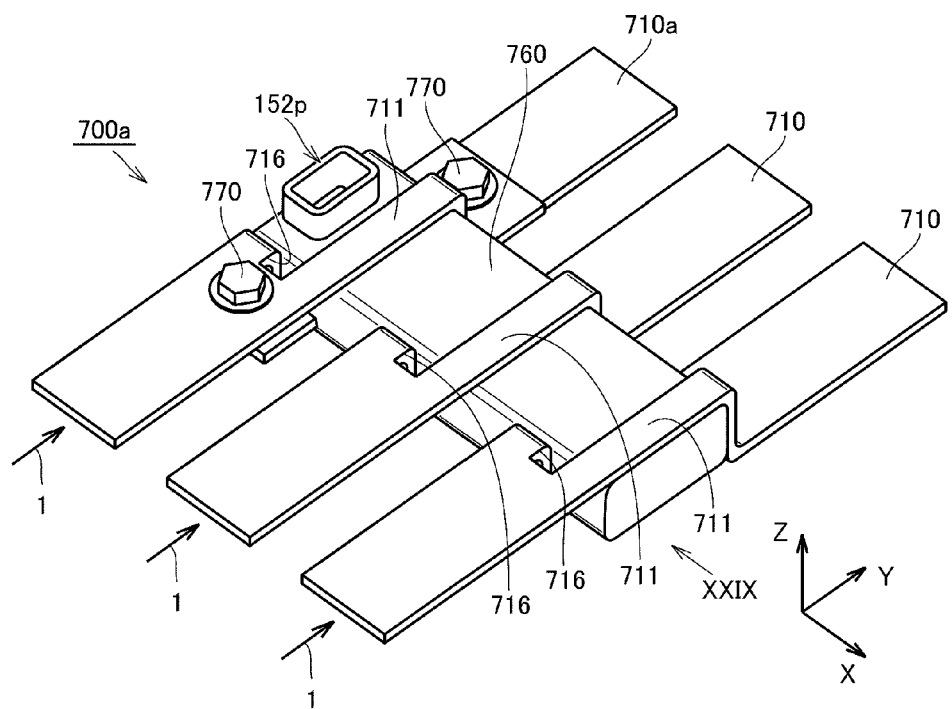
FIG. 28 is a perspective view illustrating the appearance of a current sensor according to a modification of the seventh preferred embodiment of the present invention.
Figure 29:
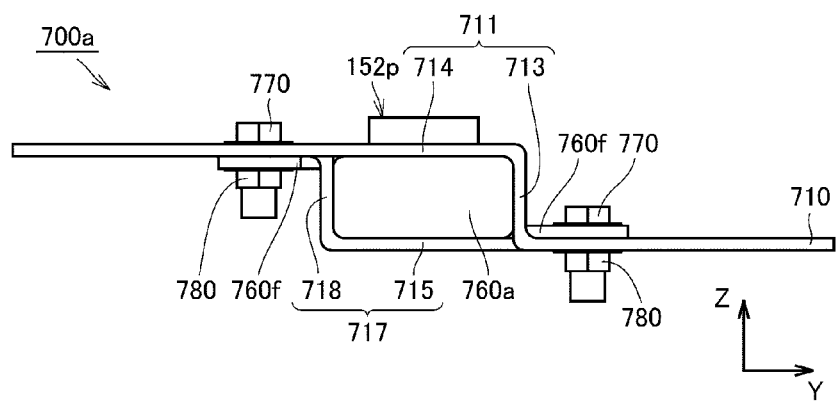
FIG. 29 is a side view of the current sensor illustrated in FIG. 28 viewed in the direction of arrow XXIX.

The housing of the magnetic sensor unit 160 may preferably be provided with flanges used to fix a conductor. FIG. 28 is a perspective view illustrating a current sensor according to a modification of the seventh preferred embodiment of the present invention. FIG. 29 is a side view of the current sensor illustrated in FIG. 28 viewed in the direction of arrow XXIX.

As illustrated in FIGS. 28 and 29, a current sensor 700a according to the modification of the seventh preferred embodiment of the present invention preferably includes a single primary conductor 710a, two primary conductors 710, and a magnetic sensor unit 760. The magnetic sensor unit 760 includes a housing including flange portions 760f. Each of the flange portions 760f includes a through hole (not shown). The primary conductor 710a includes through holes (not shown) at positions corresponding to the through holes in the flange portions 760f. Bolts 770 are inserted through the through holes in the flange portions 760f and the through holes in the primary conductor 710a and are screwed to nuts 780, so that the magnetic sensor unit 760 and the primary conductor 710a are fastened together. Each of the bolts 770 and the nuts 780 is preferably made of a non-magnetic material.

In the current sensor 700a according to the modification of the seventh preferred embodiment of the present invention, the magnetic sensor unit 760 is able to be reliably attached to the primary conductor 710a by using the bolts 770 and the nuts 780.

Eighth Preferred Embodiment

A current sensor according to an eighth preferred embodiment of the present invention will now be described. A current sensor 800 according to the present preferred embodiment differs from the current sensor 700 according to the seventh preferred embodiment primarily in that each of the three primary conductors is composed of two conductors. Description of the structure similar to that of the current sensor 700 according to the seventh preferred embodiment will not be repeated.

Figure 30:
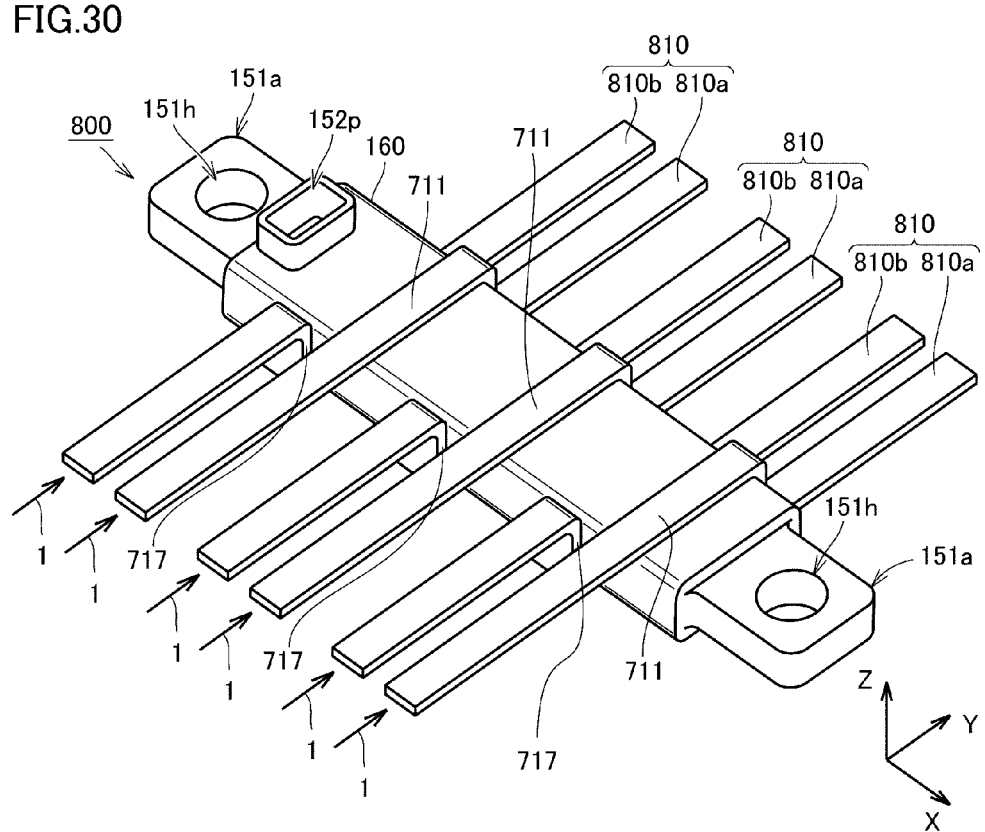
FIG. 30 is a perspective view illustrating the structure of primary conductors and a magnetic sensor unit included in a current sensor according to an eighth preferred embodiment of the present invention.

FIG. 30 is a perspective view illustrating the structure of primary conductors and a magnetic sensor unit included in the current sensor according to the eighth preferred embodiment of the present invention. As illustrated in FIG. 30, the current sensor 800 according to the eighth preferred embodiment of the present invention preferably includes primary conductors 810, each of which includes two conductors that are electrically connected to each other at both ends thereof. More specifically, each primary conductor 810 includes one path portion and another path portion through which portions of the current to be measured separately flow at an intermediate position in the length direction (Y-axis direction). The one path portion and the other path portion each includes a bent portion.

Among the two conductors, a first conductor 810a, which defines the one path portion, includes a bent portion 711. Also, among the two conductors, a second conductor 810b, which defines as the other path portion, includes a bent portion 717. The first conductor 810a and the second conductor 810b, which are spaced apart from each other in the width direction of each primary conductor 810 (X-axis direction) and extend parallel or substantially parallel to each other in the length direction of each primary conductor 810 (Y-axis direction), are connected to each other at both ends thereof by connection wires (not shown).

The primary conductors 810 of the current sensor 800 according to the present preferred embodiment also have a high flexibility in shape and arrangement. In addition, the current sensor 800 is able to be easily assembled, and the sensitivity thereof is increased.

The structures of the above-described preferred embodiments that can be combined with each other may be applied in combination.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A current sensor comprising:
 a plurality of primary conductors, through each of which a current to be measured flows and which are arranged parallel or substantially parallel to each other;
 a plurality of magnetic sensors, each of which corresponds to one of the plurality of primary conductors and detects an intensity of a magnetic field generated by the current to be measured that flows through the corresponding primary conductor; and
 a single housing that accommodates the plurality of magnetic sensors; wherein
 each of the plurality of primary conductors includes a front surface and a back surface, has a length direction, a width direction orthogonal or substantially orthogonal to the length direction, and a thickness direction orthogonal or substantially orthogonal to the length direction and the width direction, and further includes a bent portion that is bent to surround at least a portion of an outer periphery of the housing at an intermediate position in the length direction when viewed in the width direction;
 the housing is disposed in a region surrounded by the bent portion of each of the plurality of primary conductors when viewed in the width direction;
 each of the plurality of primary conductors includes one path portion and another path portion through which portions of the current separately flow at an intermediate position in the length direction;
 the one path portion and the other path portion each include the bent portion; and
 the housing is disposed in a region surrounded by the bent portion of the one path portion and the bent portion of the other path portion when viewed in the width direction.

2. The current sensor according to claim 1, wherein
 the housing has a longitudinal direction; and
 the longitudinal direction of the housing coincides or substantially coincides with the width direction of each of the plurality of primary conductors.

3. The current sensor according to claim 1, wherein
 the bent portion of the one path portion bulges at a front surface of each of the plurality of primary conductors; and
 the bent portion of the other path portion bulges at a second surface of each of the plurality of primary conductors.

4. The current sensor according to claim 1, wherein each of the plurality of primary conductors includes the bent portion that bulges at a front surface of each of the plurality of primary conductors.

5. The current sensor according to claim 1, wherein each of the plurality of primary conductors includes the bent portion that bulges at a back surface of each of the plurality of primary conductors.

6. The current sensor according to claim 1, wherein
the bent portion of the one path portion and the bent portion of the other path portion each includes one end and another end in the length direction;
the one end of the bent portion of the one path portion and the other end of the bent portion of the one path portion in the length direction are at different positions in the thickness direction;
the one end of the bent portion of the other path portion and the other end of the bent portion of the other path portion in the length direction are at different positions in the thickness direction;
the one end of the bent portion of the one path portion and the one end of the bent portion of the other path portion in the length direction are at a same or substantially a same position in the thickness direction;
the other end of the bent portion of the one path portion and the other end of the bent portion of the other path portion in the length direction are at a same or substantially a same position in the thickness direction;
the one path portion includes a crank portion that connects a position of the one end of the bent portion of the one path portion and a position of the other end of the bent portion of the one path portion in the thickness direction;
the bent portion of the other path portion includes a crank portion that connects a position of the one end of the bent portion of the other path portion and a position of the other end of the bent portion of the other path portion in the thickness direction; and
the crank portion of the bent portion of the one path portion and the crank portion of the bent portion of the other path portion are spaced apart from each other in the length direction.

7. The current sensor according to claim 1, wherein the one path portion and the other path portion are included in a single conductor.

8. The current sensor according to claim 1, wherein the housing includes an engagement portion that engages with one of the plurality of primary conductors.

9. The current sensor according to claim 1, further comprising a base to which the plurality of primary conductors and the plurality of magnetic sensors are attached.

10. The current sensor according to claim 9, wherein the base includes a plurality of grooves that are shaped so as to match shapes of the plurality of primary conductors.

11. The current sensor according to claim 1, wherein the one path portion and the other path portion are respectively included in two separate conductors.

12. The current sensor according to claim 11, wherein the two conductors are electrically connected to each other at both ends thereof.

13. The current sensor according to claim 11, wherein the two conductors are spaced apart from each other in the width direction of plurality of primary conductors and extend parallel or substantially parallel to each other in the length direction of the plurality of primary conductors.

14. The current sensor according to claim 11, wherein the two conductors extend parallel or substantially parallel to each other in the length direction of the plurality of primary conductor and are stacked on one another in the thickness direction of the plurality of primary conductors.

15. The current sensor according to claim 1, wherein each of the plurality of primary conductors includes a slit that extends in the length direction of the plurality of primary conductors adjacent to the bent portion in the width direction of the plurality of primary conductors.

16. The current sensor according to claim 1, wherein
the bent portion of the one path portion is an arch-shaped portion including a first projecting portion, a second projecting portion, and an extending portion;
the first projecting portion and the second projecting portion are spaced apart from each other and project in a direction orthogonal or substantially orthogonal to a first surface of a respective one of the plurality of primary conductors;
the extending portion extends in the length direction of the plurality of primary conductors and connects the first projecting portion and the second projecting portion to each other;
the bent portion of the other path portion is an inverted-arch-shaped portion includes a third projecting portion, a fourth projecting portion, and an extending portion;
the third projecting portion and the fourth projecting portion are spaced apart from each other and project in a direction orthogonal or substantially orthogonal to a second surface of the respective one of the plurality of primary conductors;
the extending portion extends in the length direction of the plurality of primary conductors and connects the third projecting portion and the fourth projecting portion to each other.

17. The current sensor according to claim 16, wherein the arch-shaped portion and the inverted-arch-shaped portion have the same or substantially the same shape.

18. The current sensor according to claim 1, wherein the housing is made of polyphenylene sulfide.

* * * * *